(12) United States Patent
Sugimae et al.

(10) Patent No.: US 7,504,294 B2
(45) Date of Patent: Mar. 17, 2009

(54) METHOD OF MANUFACTURING AN ELECTRICALLY ERASABLE PROGRAMMABLE READ-ONLY MEMORY (EEPROM)

(75) Inventors: Kikuko Sugimae, Yokohama (JP); Hiroyuki Kutsukake, Yokohama (JP); Masayuki Ichige, Yokohama (JP); Michiharu Matsui, Fujisawa (JP); Yuji Takeuchi, Yokohama (JP); Riichiro Shirota, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 10/881,180

(22) Filed: Jul. 1, 2004

(65) Prior Publication Data

US 2004/0238847 A1 Dec. 2, 2004

Related U.S. Application Data

(62) Division of application No. 10/326,179, filed on Dec. 23, 2002, now Pat. No. 6,894,341.

(30) Foreign Application Priority Data

Dec. 25, 2001 (JP) .............................. 2001-390993
Mar. 15, 2002 (JP) .............................. 2002-072460

(51) Int. Cl.
*H01L 21/8238* (2006.01)

(52) U.S. Cl. ....................... 438/201; 438/411; 257/315; 257/E21.685

(58) Field of Classification Search ................. 438/201, 438/211; 257/315, 314, E21.685
See application file for complete search history.

(56) References Cited

U.S. PATENT DOCUMENTS

| 6,153,476 | A  | * | 11/2000 | Inaba et al. ................. 438/275 |
| 6,215,144 | B1 | * | 4/2001  | Saito et al. .................. 257/310 |
| 6,545,360 | B1 | * | 4/2003  | Ohkubo et al. .............. 257/758 |
| 6,849,490 | B2 | * | 2/2005  | Hayashi ...................... 438/201 |
| 2002/0036317 | A1 | * | 3/2002 | Matsui et al. ............... 257/315 |
| 2002/0182798 | A1 | * | 12/2002 | Saito et al. ................. 438/211 |
| 2003/0003661 | A1 | * | 1/2003 | Lee ............................ 438/258 |

FOREIGN PATENT DOCUMENTS

| JP | 8-148586 | 6/1996 |
| JP | 2000-21998 | 1/2000 |
| JP | 2000-114361 | 4/2000 |
| JP | 2000-311992 | 11/2000 |
| JP | 2002-280463 | 9/2002 |
| KR | 2001-0014829 | 2/2001 |

* cited by examiner

*Primary Examiner*—Howard Weiss
*Assistant Examiner*—John C Ingham
(74) *Attorney, Agent, or Firm*—Oblon, Spivak, McClelland, Maier & Neustadt, P.C.

(57) ABSTRACT

A semiconductor device comprises a memory cell array portion and peripheral circuit portion, wherein a first insulation film including elements as main components other than nitrogen fills between the memory cell gate electrodes of the memory cell array portion, the first insulation film is formed as a liner on a sidewall of a peripheral gate electrode of the peripheral circuit portion simultaneously with the memory cell portion, and a second insulation film including nitrogen as the main component is formed on the sidewall of the peripheral gate electrode via the first insulation film, thus enabling not only the formation of the memory cell portion having high reliability, but also the formation of a peripheral circuit with good efficiency, simultaneously, and avoiding gate offset of a peripheral gate.

2 Claims, 40 Drawing Sheets

METHOD OF MANUFACTURING AN ELECTRICALLY ERASABLE PROGRAMMABLE READ-ONLY MEMORY (EEPROM)

CROSS-REFERENCE TO RELATED APPLICATIONS

This application is a divisional of and claims benefit under 35 USC §120 from U.S. application Ser. No. 10/326,179, filed Dec. 23, 2002, and is based upon and claims the benefit of priority under 35 USC §119 from Japanese Patent Applications 2001-390993, filed Dec. 25, 2001; and No. 2002-072460, filed Mar. 15, 2002, the entire contents of which are incorporated by reference herein.

BACKGROUND OF THE INVENTION

1. Field of the Invention

The present invention relates to a semiconductor device which includes a memory cell portion including a memory cell gate and selection gate and a peripheral circuit portion including a peripheral gate, and a manufacturing method of the semiconductor device.

2. Description of the Related Art

An electrically erasable programmable read-only memory (EEPROM) which electrically writes/erases data has heretofore been known as a semiconductor memory. In the EEPROM, memory cells are arranged in intersections of rows and columns intersecting with one another to constitute a memory cell array. In the memory cell, a MOS transistor including a stacked gate structure is used in which floating and control gates are stacked.

In the EEPROM, at a data write/erase operation time, an operation is performed which comprises: applying a strong electric field between the control gate and a channel; passing a tunnel current through a gate insulation film; and implanting or removing charges with respect to the floating gate. In this operation, when a tunnel current flows in the vicinity of the gate insulation film, an electric stress is applied to the gate insulation film.

Moreover, it is generally known that there are a large number of traps with respect to the charges in a silicon nitride film. Particularly when the charges are captured in the traps in the silicon nitride film covering the surface of a source/drain diffusion layer, the diffusion layer in the vicinity of the surface of a substrate is depleted. As a result, a parasitic resistance of the source/drain increases, and drop of on-current of the transistor is caused.

Moreover, when the charges are trapped in the silicon nitride film in the vicinity of the gate insulation film, deterioration of electric characteristics occurs such as fluctuation of a threshold voltage of the transistor, and drop of withstanding voltage of a silicon oxide film. That is, when a material having high dielectric constant exists between the gates of the memory cell transistors disposed at a small interval, electrons are trapped. This raises a problem that the value of even a transistor disposed adjacent to the transistor with voltage applied thereto rises.

Particularly in a NAND flash memory, a large number of, such as 16 or 32, memory cell transistors are connected in series and are arranged close to one another. Therefore, when miniaturization advances, a voltage change of a specific memory cell transistor exerts an influence onto another memory cell transistor disposed adjacent to the specific transistor, and there is possibility of an erroneous operation or a problem in reliability.

When there is a film containing a large hydrogen content in the vicinity of the gate insulation film, hydrogen is taken into the silicon oxide film and structure defects such as Si—H coupling are easily generated in an interface with a silicon substrate.

More specifically, a portion of $SiO_2$ bonds is replaced with H, thereby making free bonds which serve as trap centers.

When the above-mentioned Si—H coupling is cut by an electric stress, and the like, a cut portion functions as a trap with respect to the charge. Particularly when this trap is generated in the silicon oxide film as the gate insulation film, or a post oxide film in the vicinity of the gate insulation film, the deterioration of the electric characteristics such as fluctuation of the threshold voltage of the transistor and drop of the silicon oxide film withstanding voltage are caused.

Moreover, the charges are captured in the traps of the post oxide film with which the surface of the source/drain diffusion layer is covered. Then, the diffusion layer in the vicinity of the substrate surface is depleted. As a result, the parasitic resistance of the source/drain increases, and drop of the on current of the transistor is sometimes caused.

This problem becomes particularly remarkable, when a gate length is smaller than about 0.2 μm. That is, when the silicon oxide film, post oxide film, or silicon nitride film in which the traps are generated in the vicinity of the gate insulation film occupy a large ratio in the whole gate, this problem becomes remarkable.

The silicon nitride film is necessary for selective etching in forming a contact hole. On the other hand, since adverse influence of the silicon nitride film is seen with respect to the electric characteristics, it is difficult to enhance both yield and reliability of the semiconductor device.

To solve the problem, in Jap. Pat. Appln. KOKAI No. 2002-280463 as a prior application, when a contact hole is formed after gate processing, under a second insulation film (silicon nitride film) as an etching stopper, another first insulation film is disposed. This first insulation film is disposed to fill between gate electrodes of the memory cell transistor. Thereby, the influence of hydrogen in the second insulation film or charges captured in the second insulation film onto the electric characteristics of a device can be reduced.

Particularly in a memory cell portion, the first insulation film fills between the gate electrodes, and the second insulation film does not exist in the vicinity of the gate insulation film of the transistor. Therefore, the characteristics of the memory cell transistor can be prevented from being deteriorated, and reliability enhancement of the device results. That is, when the silicon oxide film is disposed between the gates of the memory cell transistor, the charges can be prevented from being trapped in the film having high dielectric constant between the gates.

However, in this structure, the first and second insulation films are also formed simultaneously with respect to a peripheral transistor. For the peripheral transistor, different from the memory cell, it is necessary to form an LDD structure as a hot electron countermeasure, or suppress a short channel effect by diffusion of impurities. To satisfy the above-described demand, it is a problem that the insulation film which is thick enough to fill between the memory cell transistors are also formed in the peripheral transistor. That is, when a gate sidewall insulation film is thick, the source/drain diffusion layer is offset from the gate, and the characteristics deterioration of the peripheral transistor are brought.

Therefore, there has been a demand for realization of a structure of a semiconductor device and manufacturing method of the device in which a peripheral transistor can efficiently be formed simultaneously with a high-reliability memory cell, and high reliability and high yield can be achieved.

BRIEF SUMMARY OF THE INVENTION

According to a first aspect of the present invention, there is provided a semiconductor device comprising:

a semiconductor substrate;

a plurality of first diffusion regions arranged apart from one another substantially in line on the semiconductor substrate;

a plurality of memory cell gate electrodes insulatively formed on the semiconductor substrate between the first diffusion regions disposed adjacent to each other;

a second diffusion region formed adjacent to and apart from an end of the plurality of first diffusion regions formed substantially in line on the semiconductor substrate;

a selection gate electrode insulatively formed on the semiconductor substrate between the end of the first diffusion regions and the second diffusion region;

a peripheral gate electrode insulatively formed on the semiconductor substrate apart from the plurality of memory cell gate electrodes and the selection gate electrode;

a first insulation film filled between adjacent ones of the plurality of memory cell gate electrodes and between the end of the plurality of memory cell gate electrodes and the selection gate electrode, formed at a substantially uniform thickness on a side surface of the peripheral gate electrode, and including a main component other than nitrogen; and a second insulation film formed on at least the side surface of the peripheral gate electrode via the first insulation film and formed of a material different from that of the first insulation film.

According to a second aspect of the present invention, there is provided a semiconductor device, comprising:

a semiconductor substrate;

a first and a second memory cell array disposed on the semiconductor substrate, each of the first and the second memory cell array comprising:

- a plurality of memory cell transistors each having a memory cell gate and source/drain diffusion regions, the memory cell transistors being disposed adjacent to one another sharing one of the source/drain diffusion regions and being connected in series; and
- selection transistors formed on the semiconductor substrate at opposite ends of the plurality of memory cell transistors connected in series, sharing one of the source/drain diffusion regions with the memory cell transistors of the opposite ends, and having a first diffusion region disposed on the semiconductor substrate as the other of the source/drain diffusion regions,
- one of the selection transistors of the first memory cell array being disposed adjacent to one of the selection transistors of the second memory cell array to share the first diffusion region;

a peripheral circuit portion disposed apart from the first and the second memory cell array and having a peripheral transistor formed on the semiconductor substrate, the peripheral transistor including a peripheral gate electrode;

a first insulation film filled between adjacent ones of the plurality of memory cell transistors, formed at a substantially uniform thickness on a side surface of the peripheral gate electrode so as to set a thickness between the memory cell gates to be larger than the substantially uniform thickness on the side surface of the peripheral electrode, formed at a substantially zero thickness on a surface of the semiconductor substrate on opposite sides of the peripheral gate electrode, and including a main component other than nitrogen; and a second insulation film formed on at least the side surface of the peripheral gate electrode via the first insulation film.

According a third aspect of the present invention, there is provided a manufacturing method of a semiconductor device, comprising:

forming a first gate electrode layer, a first insulation film, and a second gate electrode layer on a semiconductor substrate in this order;

by processing the second gate electrode layer, the first insulation film, and the first gate electrode layer by lithography, forming a plurality of memory cell gate electrodes in a memory cell portion, while simultaneously forming a peripheral gate electrode in a peripheral circuit portion;

by using the plurality of memory cell gate electrodes and the peripheral gate electrode as masks, forming a plurality of diffusion regions on the semiconductor substrate; and forming a second insulation film so as to fill between adjacent ones of the plurality of memory cell gate electrodes and cover the memory cell gate electrodes of the memory cell portion entirely and continuously, while simultaneously forming the second insulation film along a side surface of the peripheral gate electrode of the peripheral circuit portion and along the semiconductor substrate adjacent to an underpart of the peripheral gate electrode, and removing the second insulating film formed on the semiconductor substrate adjacent to the underpart of the peripheral gate electrode.

According a fourth aspect of the present invention, there is provided a manufacturing method of a semiconductor device, comprising:

forming a first memory cell gate array including a plurality of memory cell gate electrodes, a first selection gate pair formed on opposite ends of the first memory cell gate array, a second memory cell gate array including a plurality of memory cell gate electrodes, and a second selection gate pair formed on opposite ends of the second memory cell gate array such that one gate of the second selection gate pair is disposed adjacent to one gate of the first selection gate pair, while forming a plurality of peripheral gates apart from the first memory cell gate array, the first selection gate pair, the second memory cell gate array, and the second selection gate pair on a semiconductor substrate;

by using the first memory cell gate array, the first selection gate pair, the second memory cell gate array, the second selection gate pair, and the plurality of peripheral gates as masks, forming a plurality of diffusion regions in the semiconductor substrate;

forming a first insulation film including a main component other than nitrogen over a whole surface of the semiconductor substrate, so as to fill between adjacent ones of the plurality of memory cell gate electrodes, between the opposite ends of the first memory cell gate array and the first selection gate pair, and between the opposite ends of the second memory cell gate array and the second selection gate pair, and to form the first insulation film on a side surface of one gate of the first selection gate pair disposed adjacent to and opposite to that of one gate of the second selection gate pair, a first region of the semiconductor substrate between the opposite selection gates, side surfaces of the plurality of peripheral gates, and a second region of the semiconductor substrate disposed adjacent to the side surfaces of the peripheral gays;

removing the first insulation film on the first and the second region;

forming a second insulation film including nitrogen as the main component over a whole exposed surface;

forming an interlayer insulation film having a large etching selectivity to the second insulation film on the second insulation film;

etching the interlayer insulation film on the first region to form a contact hole; and filling a conductive material in the contact hole to connect the conductive material to one of the plurality of diffusion regions formed in the first region.

According to a fifth aspect of the present invention, there is provided a semiconductor device, comprising;

a semiconductor substrate;

a plurality of first diffusion regions arranged apart from one another substantially in line on the semiconductor substrate;

a plurality of memory cell gate electrodes insulatively formed on the semiconductor substrate between the first diffusion regions disposed adjacent to each other;

a second diffusion region formed adjacent to and apart an end of the plurality of first diffusion regions formed in line on the semiconductor substrate;

a selection gate electrode insulatively formed on the semiconductor substrate between the end of the first diffusion regions formed in line and the second diffusion region;

a peripheral gate electrode insulatively formed on the semiconductor substrate apart from the plurality of memory cell gate electrodes and the selection gate electrode;

a pair of third diffusion regions formed on the semiconductor substrate such that the peripheral gate electrode is formed between the third diffusion regions;

a first insulation film filled between adjacent ones of the plurality of memory cell gate electrodes and between the end of the plurality of memory cell gate electrodes formed in line and the selection gate electrode, formed on a side surface of the peripheral gate electrode, including a main component other than nitrogen, and a thickness of the first insulating film between the memory cell gate electrodes being larger than thickness of the first insulation film formed on an upper half side surface of the peripheral gate electrode; and a second insulation film formed on at least the side surface of the peripheral electrode via the first insulation film and formed of a material different from that of the first insulation film.

According a sixth aspect of the present invention, there is provided a manufacturing method of the present invention, comprising:

forming a first gate electrode layer, a first insulation film, and a second gate electrode layer on a semiconductor substrate in this order;

by processing the second gate electrode layer, the first insulation film, and the first gate electrode layer by lithography, forming a plurality of memory cell gate electrodes in a memory cell portion, while simultaneously forming a peripheral gate electrode in a peripheral circuit portion;

by using the plurality of memory cell gate electrodes as masks, forming a plurality of first diffusion regions on the semiconductor substrate;

forming a second insulation film so as to line the exposed surfaces of the plurality of memory cell gate electrodes of the memory cell portion, the semiconductor substrate exposed between the plurality of memory cell gate electrodes, the exposed surface of the peripheral gate electrode of the peripheral circuit portion, and the semiconductor substrate adjacent to an underpart of the peripheral gate electrode;

removing a portion of the second insulation film which covers the peripheral gate electrode;

forming a third insulation film so as to fill between the plurality of memory gate electrodes via the second insulation film and to simultaneously line the peripheral gate electrode; and by using the peripheral gate electrode as a mask, forming a pair of second diffusion regions on the semiconductor substrate.

DETAILED DESCRIPTION OF THE INVENTION

Prior to description of embodiments of the present invention, a configuration and problem of EEPROM will generally be described.

Figure 1:
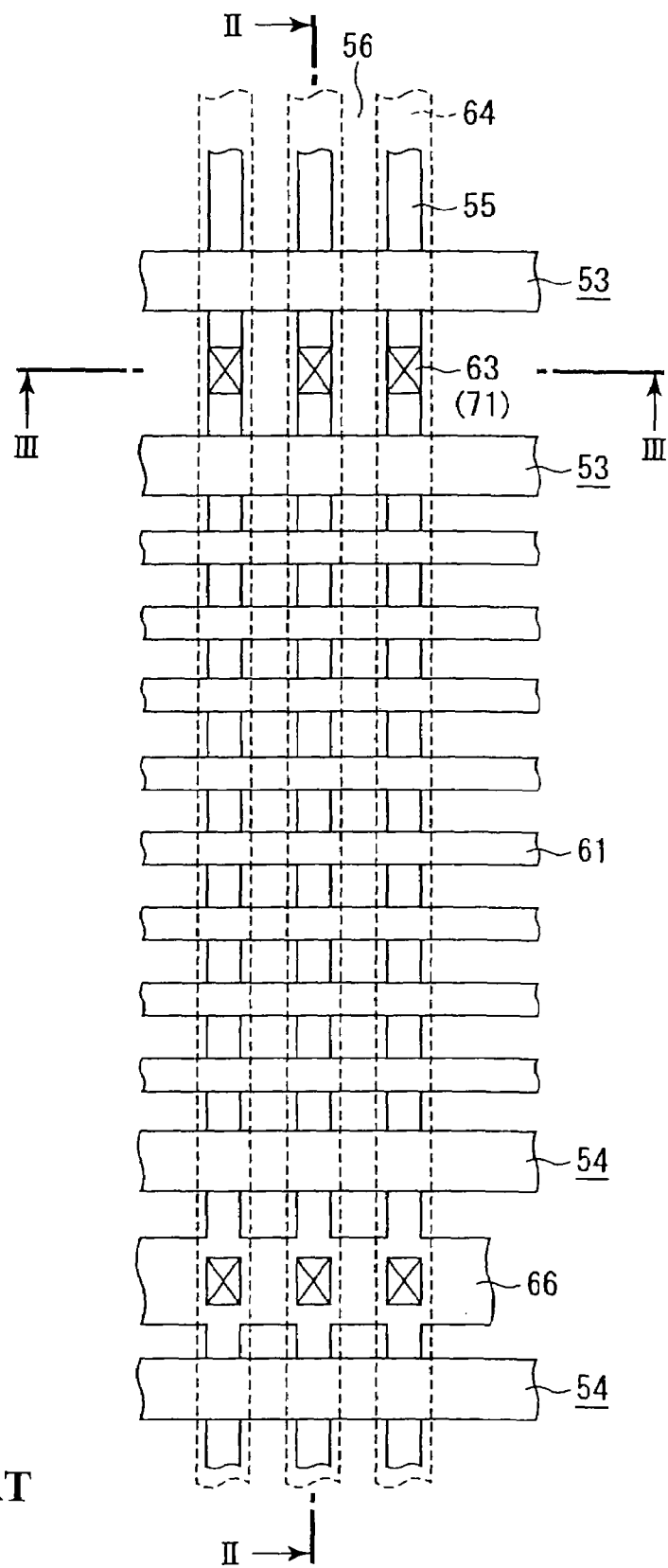
FIG. 1 is a plan view showing a layout of a memory cell portion of a conventional NAND type EEPROM.
Figure 2:
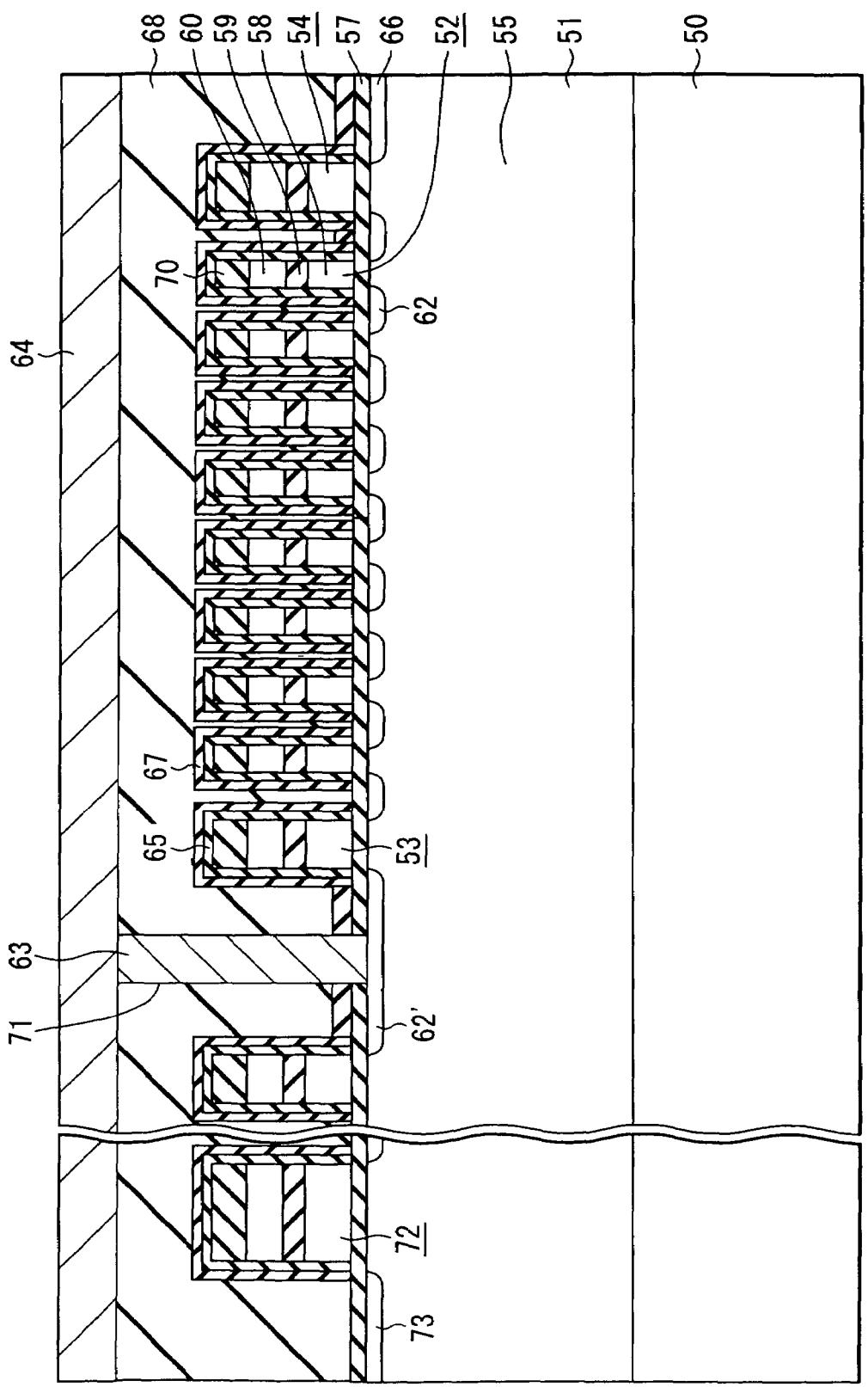
FIG. 2 is a sectional view of a prior-art NAND type EEPROM, corresponding to a section taken along line II-II of FIG. 1.
Figure 3:
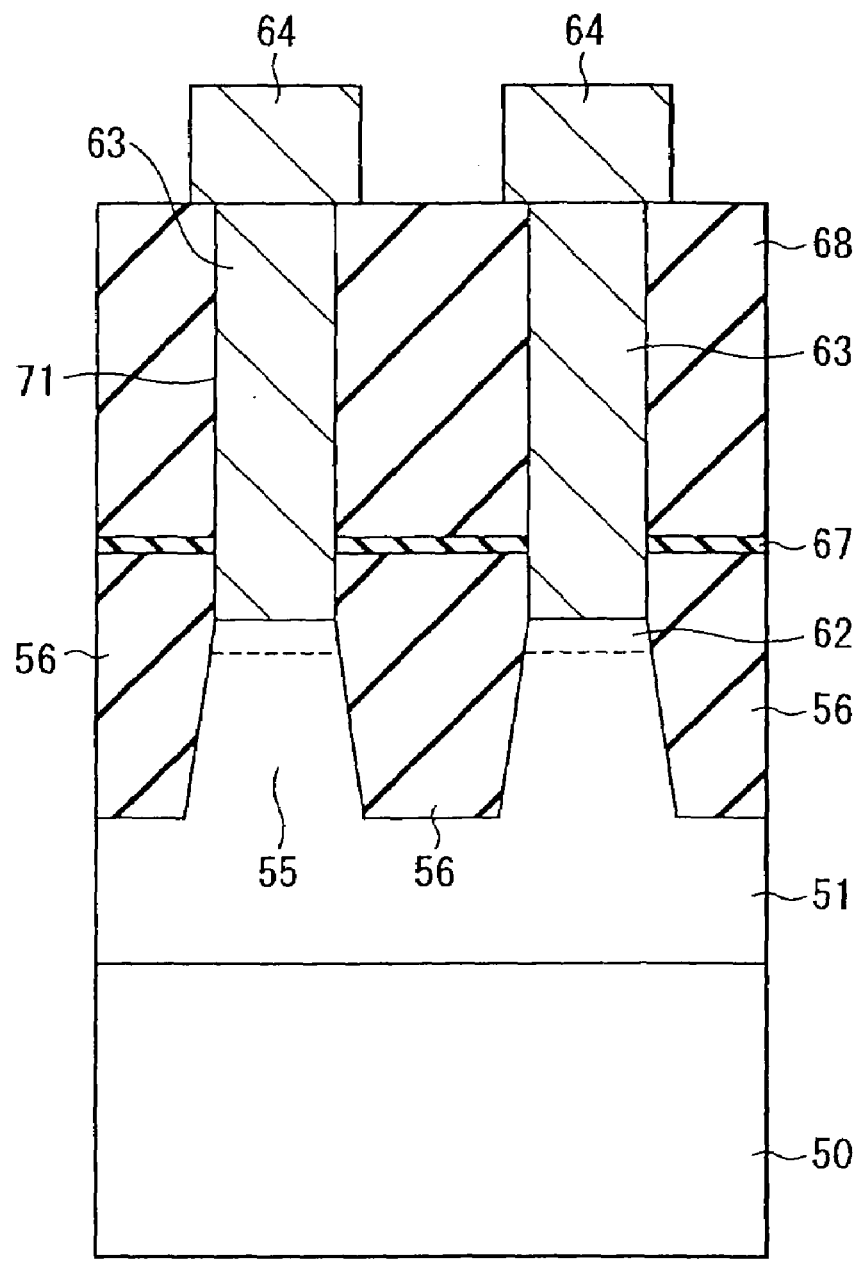
FIG. 3 is a sectional view taken along line III-III of FIG. 1.

For the EEPROM, a NAND type EEPROM shown in FIGS. 1 to 3 is known as a system suitable for a large-capacity memory. In a memory cell array of the EEPROM, a plurality of memory cell transistors are connected in series, one end is connected to a drain-side selection gate transistor 53, and the other end is connected to a source-side selection gate transistor 54. A well 51 is disposed on a portion of a semiconductor substrate 50, and a striped element region 55 is formed in the well. Each element region 55 is separated by an element isolation region 56. On the striped element region 55, a plurality of cell transistors including a stacked gate structure are arranged in columns, and cell transistors are arranged in a matrix form as the whole memory cell region. A peripheral circuit portion (not shown in FIG. 1) is disposed outside the memory cell region, and a peripheral gate 72 is disposed in the region (FIG. 2).

Each memory cell includes a gate electrode portion 52 disposed on a gate insulation film 57 on the element region 55, and the gate electrode portion 52 is formed by stacking a floating gate electrode 58 as a charge accumulation layer, inter-gate insulation film 59, control gate electrode 60, and gate mask material 70. Furthermore, the control gate electrode 60 is connected to other gate electrodes in a row line direction, and forms a word line 61.

The memory cell transistors are connected in series with each other via diffusion layer regions 62 disposed on the element region. A plurality of memory cells are connected in series to form one NAND cell (memory cell unit).

Opposite ends of the NAND cell in each bit line direction are connected to the drain-side selection gate transistor 53 and source-side selection gate transistor 54. Each of the selection gate transistors includes a gate electrode disposed on the gate insulation film 57, and is coupled to the NAND cell via the diffusion layer region 62.

Moreover, the stacked gate structure of the selection gate transistor is similar to that of the memory cell transistor, but the transistor includes an electrode structure in which a floating gate electrode and a control gate electrode are connected, and functions similarly to a conventional MOSFET.

Moreover, a bit line contact diffusion layer 62' is disposed in the element region 55 on a side of the drain-side selection gate transistor opposite to the NAND cell. This bit line contact diffusion layer 62' is connected to a bit line contact 63. This bit line contact 63 is connected to a bit line 64.

A post oxide film 65 is formed on the surfaces of the respective gates 52, 53 and 54. A silicon nitride film 67 is formed on the surface of the post oxide film 65, diffusion layer 62, drain contact diffusion layer 62, and source diffusion layer 66 on the side of the source-side selection gate transistor 54 opposite to the memory cell. An interlayer insulation film 68 is formed on the surface of the silicon nitride film 67.

Here, the bit line contact 63 is formed through the gate insulation film 57, silicon nitride film 67, and interlayer insulation film 68, and the bit line 64 is formed on the interlayer insulation film 68. The bit line is disposed so as to be separated between the NAND cells disposed adjacent to each other in a column direction.

Moreover, the source diffusion layer 66 formed on the side of the source-side selection gate transistor opposite to the NAND cell is connected to a source line. The source line is in a layer above that of the gate electrode, and connects the NAND cells disposed adjacent to each other in the column direction.

The peripheral gate 72 can supply a gate potential to the floating gate electrode 54, and similarly functions as the conventional MOSFET, and the stacked gate structure is similar to that of the memory cell gate 52. A source/drain regions 73 are disposed in the well 51 on both sides of the peripheral gate.

Moreover, as shown in FIG. 3, a plurality of element isolation regions 56 are formed so as to divide the upper surface of the element region 55 disposed in the well 51 on the semiconductor substrate 50. The bit line contact 63 is connected to the whole surface of the element region 55 held between the element isolation regions 56. The silicon nitride film 67 is formed on the element isolation region 56, and the interlayer insulation film 68 is formed on the nitride film. The bit line contact 63 is formed through these interlayer insulation film 68 and silicon nitride film 67. The bit line wiring 64 is formed on the bit line contact 63.

As described above, in the prior-art semiconductor device, the silicon nitride film 67 with which the whole surface of the gate electrode is covered is formed. A reason why the silicon nitride film 67 is necessary will be described hereinafter.

As shown in FIGS. 1 to 3, the bit line contact 63 is designed so as to have substantially no allowance with respect to the width of the element region 55. That is, the bit line contact 63 is disposed over the full width of the element region 55. It is to be noted that the width of the bit line contact 63 is sometimes larger than that of the element region 55. Thereby, the area of the cell array can be reduced as much as possible.

In this semiconductor device, even when a contact is formed in a position over the element isolation region because of misalignment of a mask, the bit line contact has to be passed through the device separation region. When the bit line contact is passed through the device separation region, the corresponding portion causes junction leak current or causes drop of device separation withstanding voltage.

To prevent this phenomenon, as described above, the silicon nitride film 67 is used in the prior-art semiconductor device. This is used to impart selectivity between the silicon oxide film and silicon nitride film in etching at a contact opening process in the miniaturized semiconductor device. Thereby, even when positioning deviation occurs, the etching can once stop on the silicon nitride film 67.

After opening the contact hole reaching the silicon nitride film 67, by a method of changing etching conditions to etch the silicon nitride film 67 and further changing the conditions to etch the silicon oxide film on the substrate, a contact hole 71 in the source/drain diffusion layer is completely opened.

When the bit line contact hole 71 is opened in this manner, the element isolation region 56 can be prevented from being largely etched, and the contact hole 71 is prevented from passing through the element isolation region 56.

However, when the silicon nitride film exists in the vicinity of the memory cell region as described above, the traps in the silicon nitride film causes problems such as characteristics deterioration of the transistor and withstanding voltage drop of the silicon oxide film.

The present invention has been developed in consideration of the problem, and the embodiments of the present invention will be described hereinafter with reference to the drawings.

First Embodiment

Figure 4:
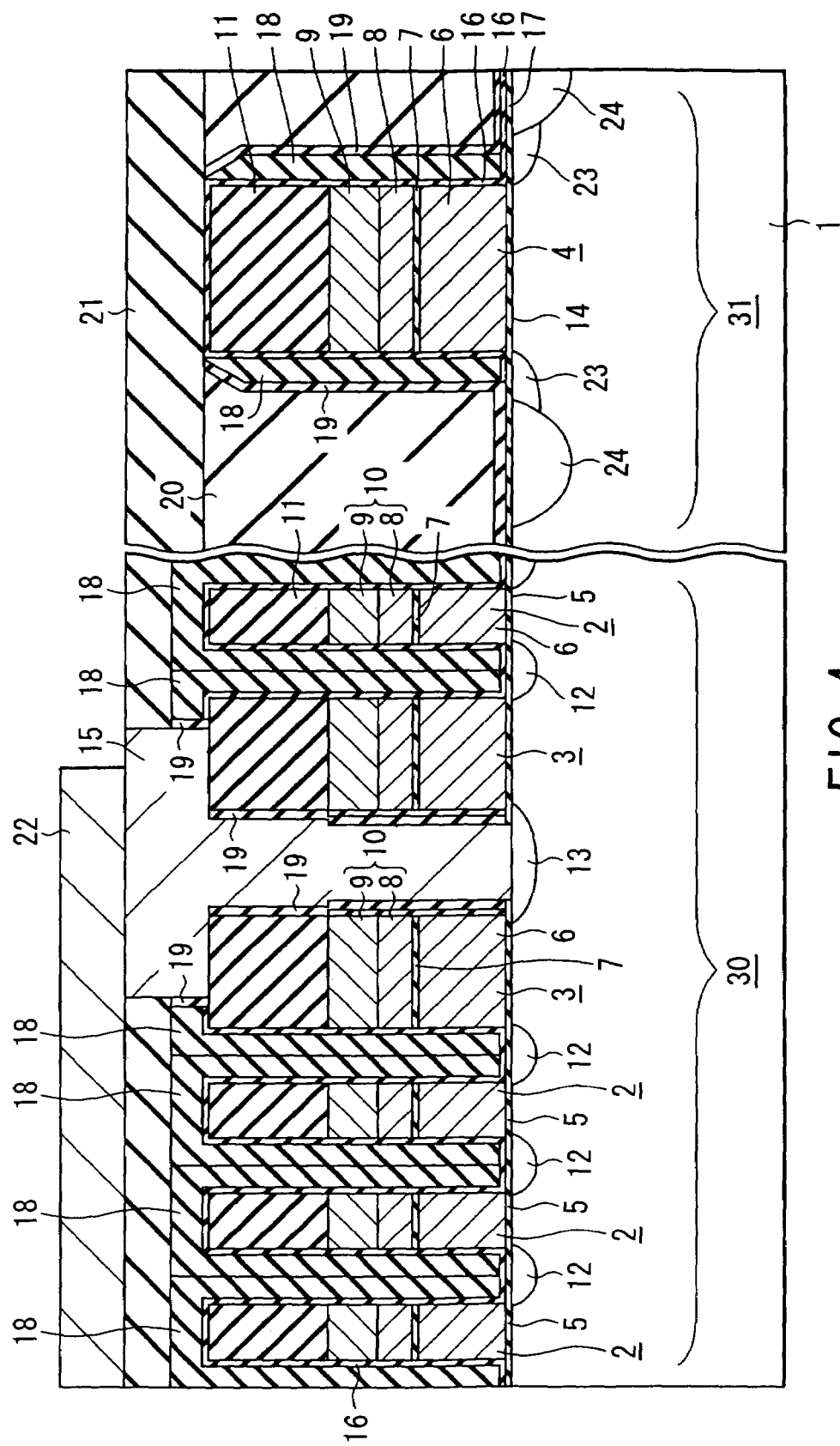
FIG. 4 is a sectional view along a bit line of a semiconductor device according to a first embodiment of the present invention.

FIG. 4 is a partial sectional view along the bit line of the semiconductor device (NAND flash memory) according to a first embodiment of the present invention. A part of a memory cell portion 30 and a part of a peripheral circuit portion 31 are shown. A bit line contact 15 is formed substantially in a middle of the memory cell portion 30, and is connected to a bit line 22.

It is to be noted that the basic arrangement of the transistor in the memory cell region and the peripheral circuit are the same as those of the conventional NAND flash memory shown in FIGS. 1 and 3, and therefore these drawings will also be referred to. The basic configuration of the section along the bit line is similar to the prior-art structure of FIG. 2, but the present embodiment is characterized by the configuration of the insulation film with which the transistor is covered.

In FIG. 4, memory cell units are arranged in left and right directions of the bit line contact 15. In the left direction, a selection gate 3 and three associated memory cell gates 2 are shown. As not shown, the end of the predetermined number of memory cell gates connected in series is connected to another selection gate (3).

Similar memory cell units are formed also in the right direction of the bit line contact 15. However, FIG. 4 shows only one selection gate 3 connected to the bit line 15 and one memory cell gate 2 disposed adjacent to the selection gate 3. The structure of another selection gate (not shown) is the same as that shown in the middle of FIG. 4, and differs in that the selection gate is connected to the source line instead of the bit line.

A peripheral gate 4 of the peripheral circuit portion 31 is formed apart from the selection gate 3 on a semiconductor substrate 1.

Each memory cell gate 2 includes a stacked structure disposed on a gate insulation film 5 on the semiconductor substrate 1. In an upward direction on the gate insulation film 5, the stacked structure includes a floating gate electrode 6 as a charge accumulation layer, inter-gate insulation film 7, control gate electrode 10 including a polycrystal silicon layer 8 and WSi layer 9, and gate mask material 11 including an SiN layer.

A source/drain region 12 of each memory cell is disposed in the semiconductor substrate 1 on the both sides of the memory cell gate 2. In the same memory cell unit, the memory cell transistors disposed adjacent to each other share one source/drain region 12, and thereby a plurality of memory cell transistors are connected in series. That is, the plurality of memory cells are connected in series to form the NAND cell (memory cell unit) as one memory cell array.

Moreover, the gate insulation film 5 is the silicon oxide film or oxynitride film, and the inter-gate insulation film 7 is an oxide-nitride-oxide (ONO) film in which the silicon nitride film is held between the silicon oxide films.

Furthermore, in the end of the memory cell array, the selection gate 3 is formed on the gate insulation film 5. The selection gate 3 includes the stacked structure similar to that of the memory cell gate 2, but the width of each layer is formed to be larger than that of the memory cell gate. In the semiconductor substrate on the side of the selection gate opposite to the memory cell, a source/drain region 13 of the selection transistor is formed to be a bit line contact diffusion layer.

Additionally, the peripheral circuit portion 31 is disposed in a region on the semiconductor substrate apart from the memory cell portion 30 to form the peripheral transistors. For the peripheral transistor, the peripheral gate 4 is disposed on a gate insulation film 14 disposed on the semiconductor substrate. The peripheral gate 4 includes the stacked structure similar to that of the memory cell gate 2, but the width of each layer is formed to be larger than that of the memory cell gate 2 or selection gate 3.

Figure 5:
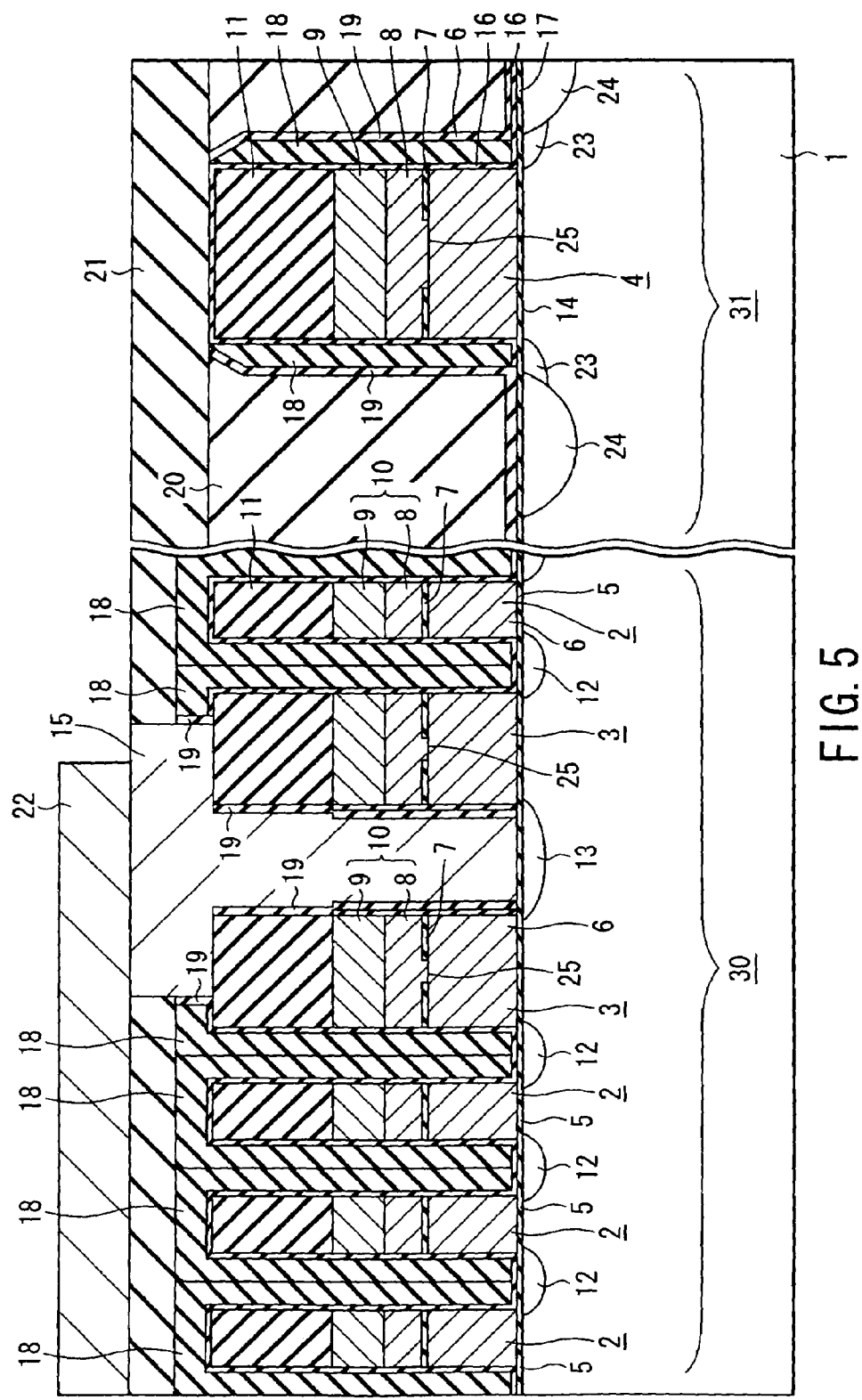
FIG. 5 is a sectional view of a modification of the semiconductor device according to the first embodiment.

Moreover, the selection gate 3 and peripheral gate 4 can supply potential to the floating gate electrode 6, and function similarly to the conventional MOSFET. In this case, as shown in FIG. 5, in the selection gate 3 and peripheral gate 4, an opening 25 is disposed in the inter-gate insulation film 7, and the floating gate electrode 6, polycrystal silicon layer 8, and WSi layer 9 may also electrically be connected in the structure.

The side surfaces of the memory cell gate 2, selection gate 3, and peripheral gate 4 are covered with a post oxide film 16. A silicon oxide film 17 is formed on the semiconductor substrate 1, and the post oxide film 16 is formed on the silicon oxide film 17.

A first insulation film 18 is disposed on the sidewall and upper surface of the memory cell transistor, one side surface of the selection gate, and side surface of the peripheral gate. The first insulation film 18 has a thickness, for example, of about 0.05 μm or more, and does not contain nitrogen as a main component. The first insulation film 18 is disposed to fill among the memory cell gates 2 of the memory cell transistors. A film having little hydrogen content and few traps with respect to charges is suitable for the first insulation film 18. Usable examples of the film include a silicon oxide film, oxynitride film, and the like. An oxynitride film is obtained by nitriding a silicon oxide film, so that the oxynitride film does not include nitrogen as a main component.

Figure 6:
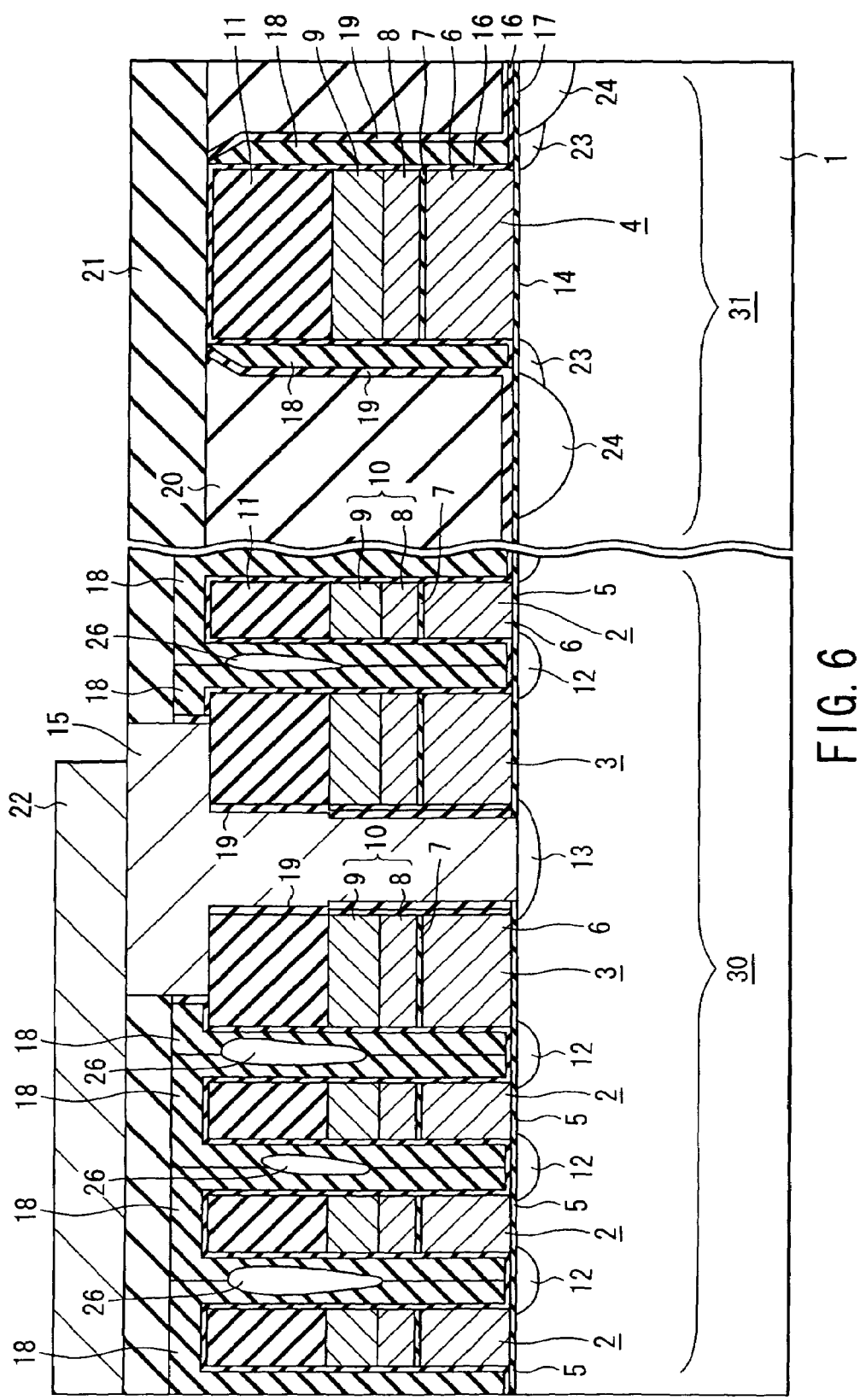
FIG. 6 is a sectional view showing a void in an insulation film allowable in the first embodiment.

In this case, to "fill" means not only completely filling but also having a cavity. Even when air gaps such as void and seam are included, the function or effect of the insulation film does not change. That is, as shown in FIG. 6, an air gap (seam) 26 may also be disposed in the first insulation film 18 between the memory cell gates 2. In this case, the upper end of the air gap 26 is closed by the first insulation film 18, and the air gap 26 should not be exposed from the first insulation film 18.

In this case, for example, an interval between the gate electrodes is about 0.2 μm, gate width is about 0.2 μm, and height is about 0.6 μm. As for the interval between the gate electrodes, an interval between the memory cell gates 2 is small, and an interval between the selection gates 3 between which the bit line contact 15 is held is large. Since the interval of the gate electrodes between the memory cell gates 2 is strongly concerned with the whole area of the memory cell array, the interval is reduced in order to reduce the area. On the other hand, since the bit line contact is formed between the selection gates of the memory cell arrays disposed adjacent to each other, the interval is large.

A second insulation film 19 is disposed on the side surface of the memory cell transistor in which the first insulation film 18 is not formed and on the first insulation film of the side surface of the peripheral gate 4. The thickness of the second insulation film 19 is about 0.02 to 0.06 μm. Since the second insulation film 19 contains nitride as a main component, and is a hydrogen supplier, the thickness is preferably as small as possible. The second insulation film 19 has more hydrogen content than that of first insulation film 18, and also has more traps with respect to the charges.

In the peripheral circuit portion 31, a first interlayer insulator 20 is disposed on the second insulation film 19. Here, the thickness of the first interlayer insulator 20 is in a range of about 0.1 μm to 0.3 μm. The first interlayer insulator 20 can be formed of silicon oxide or silicon nitride. Moreover, in the memory cell portion 30, a second interlayer insulator 21 is formed on the first insulation film 18, first interlayer insulator 20 of the peripheral circuit portion, and peripheral gate 4.

A bit line 22 is disposed on the bit line contact 15. For the number of transistors of the NAND cell, the arbitrary number, such as 16 to 32, of memory cell transistors are formed between two selection gates. Moreover, when a distance between the memory cell gates is about 0.2 μm or less, the effect of the present embodiment is remarkable.

In the present embodiment, the second insulation film 19 is disposed as an etching stopper prior to the contact hole opening in the side surfaces of the selection gates 3 disposed adjacent to and opposite to each other. Moreover, since a distance (gap) between the adjacent memory cell gates 2 is relatively small, the gap is completely filled with the first insulation film 18. Moreover, the distance between the adjacent selection gates 3 is larger than that between the adjacent memory cell gates 2, and the first insulation film 18 is not disposed between the selection gates.

A lightly-doped source/drain diffusion layer 23 is disposed in the semiconductor substrate 1 under the sidewall of the peripheral gate 4, and a heavily-doped source/drain diffusion layer 24 is disposed in the semiconductor substrate 1 outside the lightly-doped source/drain diffusion layer.

In the peripheral gate 4, the first insulation film 18 is disposed in the lower layer of the second insulation film (nitride film) 19. Thereby, the influence of hydrogen in the second insulation film 19 or charges captured in the second insulation film 19 onto electric characteristics of a transistor can be reduced.

That is, according to the semiconductor device of the present embodiment, process margin of etching for opening the contact hole is enhanced, and the deterioration of the electric characteristics such as the fluctuation of the threshold voltage of the transistor and drop of the withstanding voltage in the gate insulation film can be prevented. Therefore, there can be provided the semiconductor device and manufacturing method which have high reliability and yield.

Particularly in the memory cell transistor portion, the first insulation film 18 fills between the gate electrodes, and the second insulation film 19 does not exist in the vicinity of the gate oxide film 5 of the memory cell gate 2. Therefore, the characteristics deterioration of the memory cell transistor due to the charge trap can be prevented, and the reliability enhancement of the semiconductor device can be achieved.

Moreover, during the etching for forming the contact electrode 15, since the second insulation film (nitride film) 19 functions as the etching stopper, high reliability and yield can be obtained.

Figure 7:
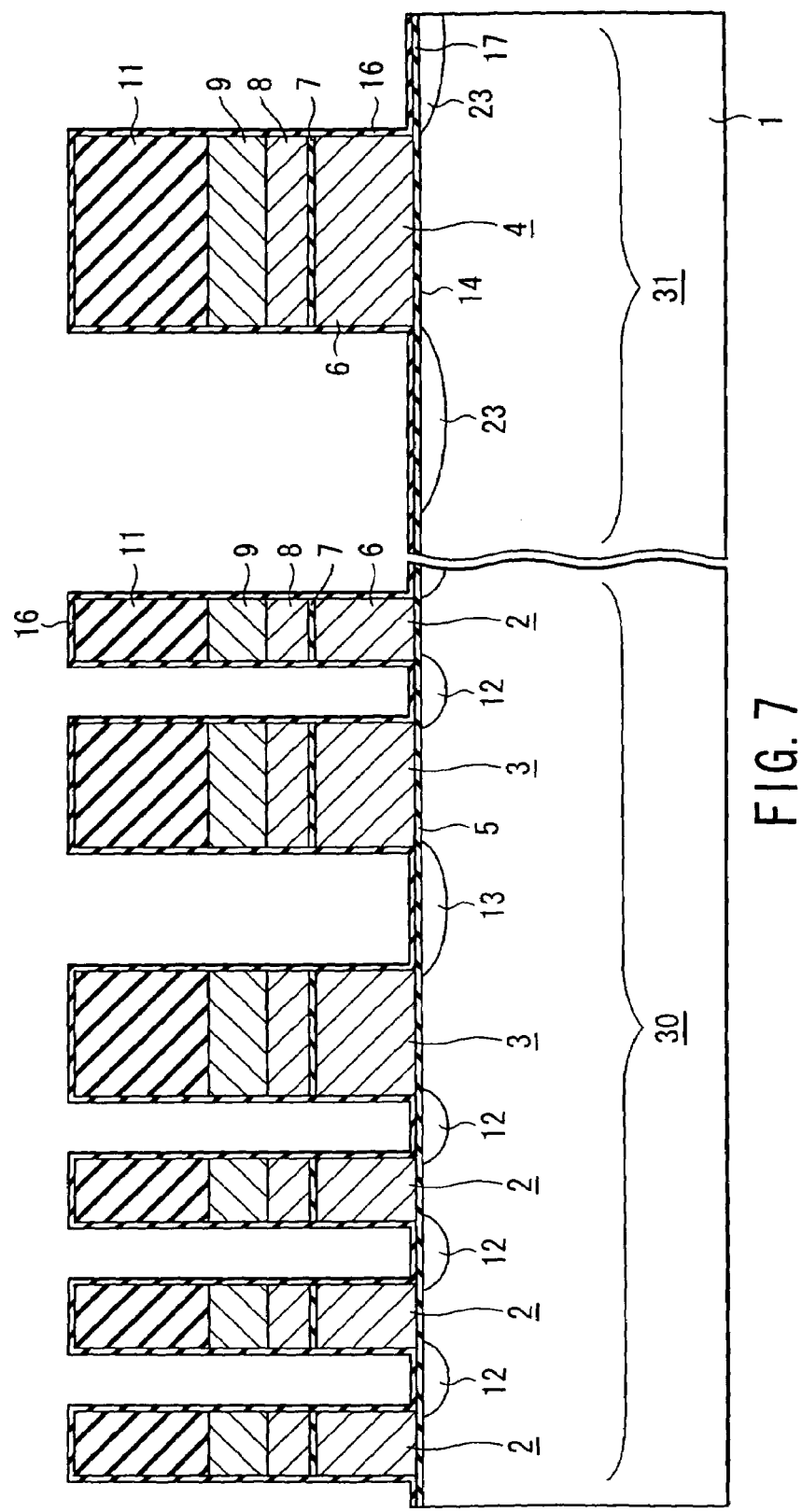
FIG. 7 is a sectional view showing one step of a manufacturing method of the semiconductor device according to the first embodiment.

A manufacturing method of the semiconductor device of the present embodiment will next be described. First, as shown in FIG. 7, the silicon oxide film 17 is disposed on the semiconductor substrate 1. The floating gate 6, inter-gate insulation film 7, polycrystal silicon layer 8, WSi layer 9, and gate mask material 11 are successively stacked, and processed into a predetermined shape to form the memory cell gate 2, selection gate 3, and peripheral gate 4.

Subsequently, post oxidation is performed in order to recover from damages at a gate processing, and the post oxide film 16 is formed around each gate electrode of the stacked structure. Next, predetermined impurities are ion-implanted in order to form the source/drain region 12, source/drain region 13 serving as the bit line contact diffusion layer, and lightly-doped diffusion layer 23 of the peripheral gate 4. The ion implantation may be performed after the first insulation film is formed in the subsequent step.

Figure 8A:
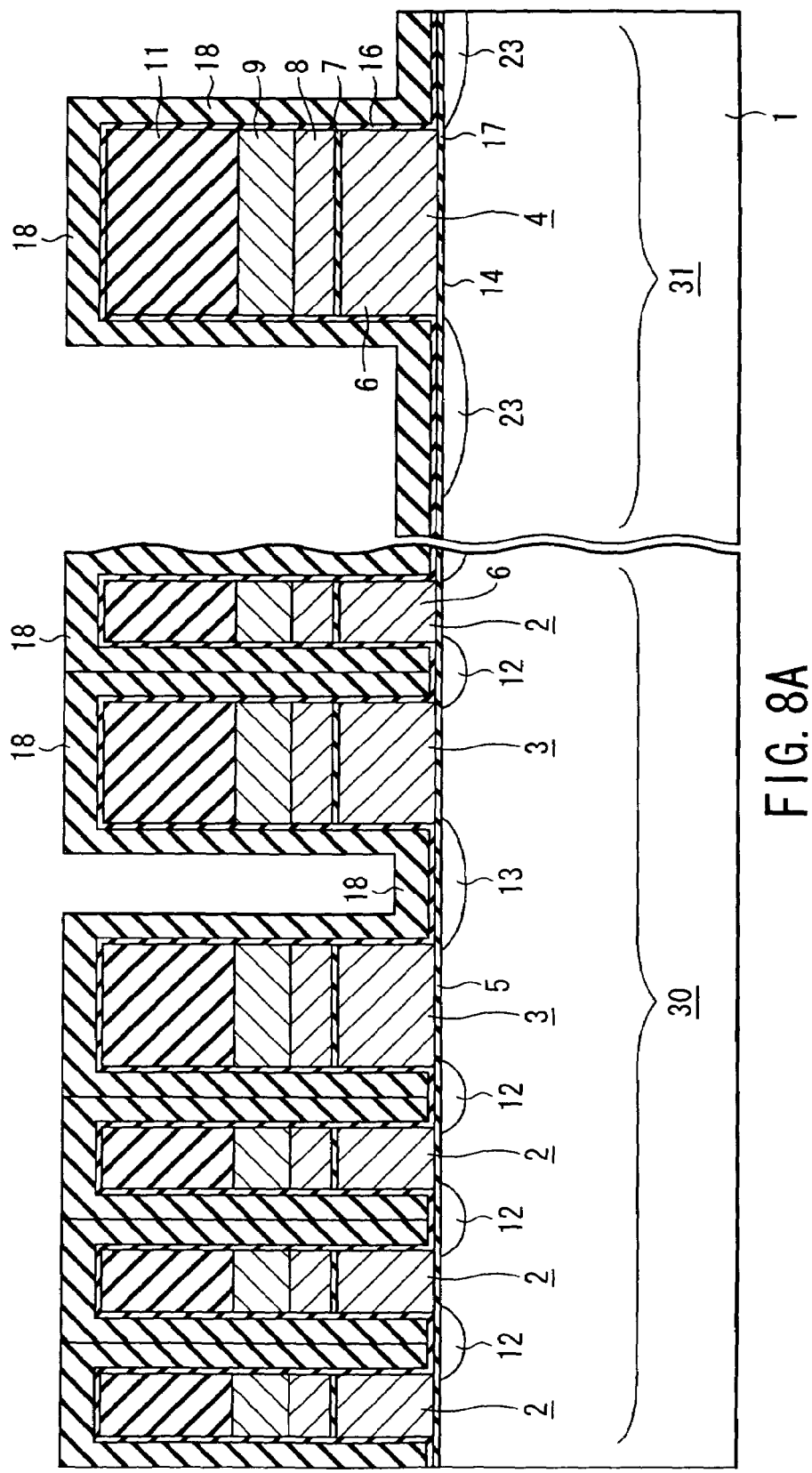
FIG. 8A is a sectional view showing a step next to that of FIG. 7.

Next, as shown in FIG. 8A, the first insulation film 18 is formed over the whole surface of the exposed part. The first insulation film 18 completely fills between the memory cell gate electrodes 2 of the memory cell transistors, and the film 18 is formed on the surface between the selection gates 3 in thickness such that the film does not completely fill between the selection gates 3.

Figure 8B:
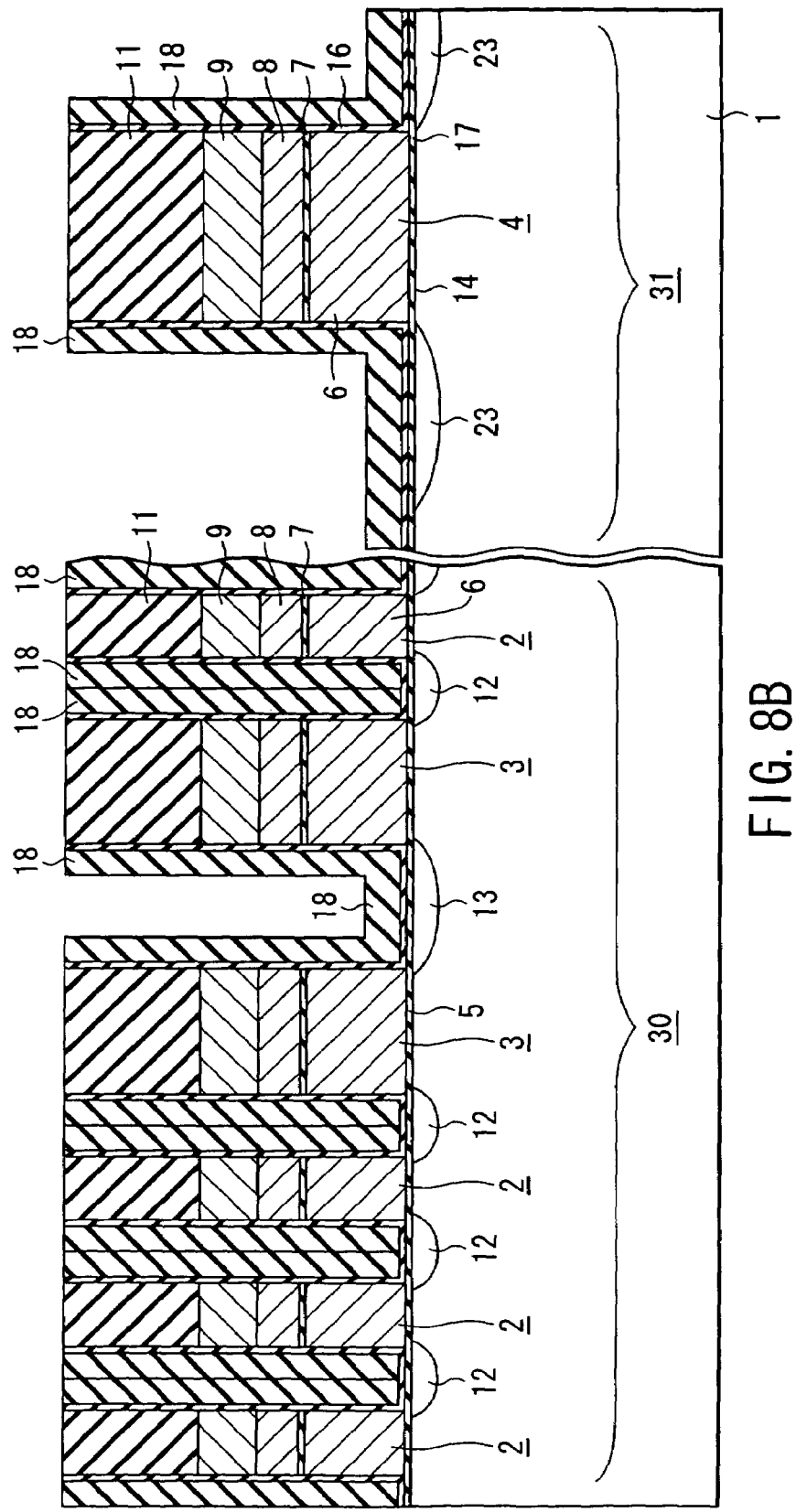
FIG. 8B shows a modification example of processing the first insulation film 18.

It is to be noted that as shown in FIG. 8B, there is another method comprising: after depositing the interlayer insulator 20, etching and removing the first insulation film 18 and post oxide film 16 by a chemical mechanical polishing (CMP) method until the memory cell gate 2, the selection gate 3, and the upper surface of the gate mask material 11 including the silicon nitride film on the peripheral gate 4 are exposed.

In this case, even when there are air gaps in the first insulation film 18 filling between the memory cell gates 2, no problem occurs.

In this manner, the sidewall spacer 18 is disposed on the peripheral gate 4 of the transistor of the peripheral portion, and the sidewall spacer 18 of the same material is also disposed on the memory cell gate 2 and selection gate 3 of the memory cell portion to fill the interval. In this manner, the reliability of the memory cell is enhanced, and a lightly doped drain (LDD) structure described later is made possible.

Figure 9:
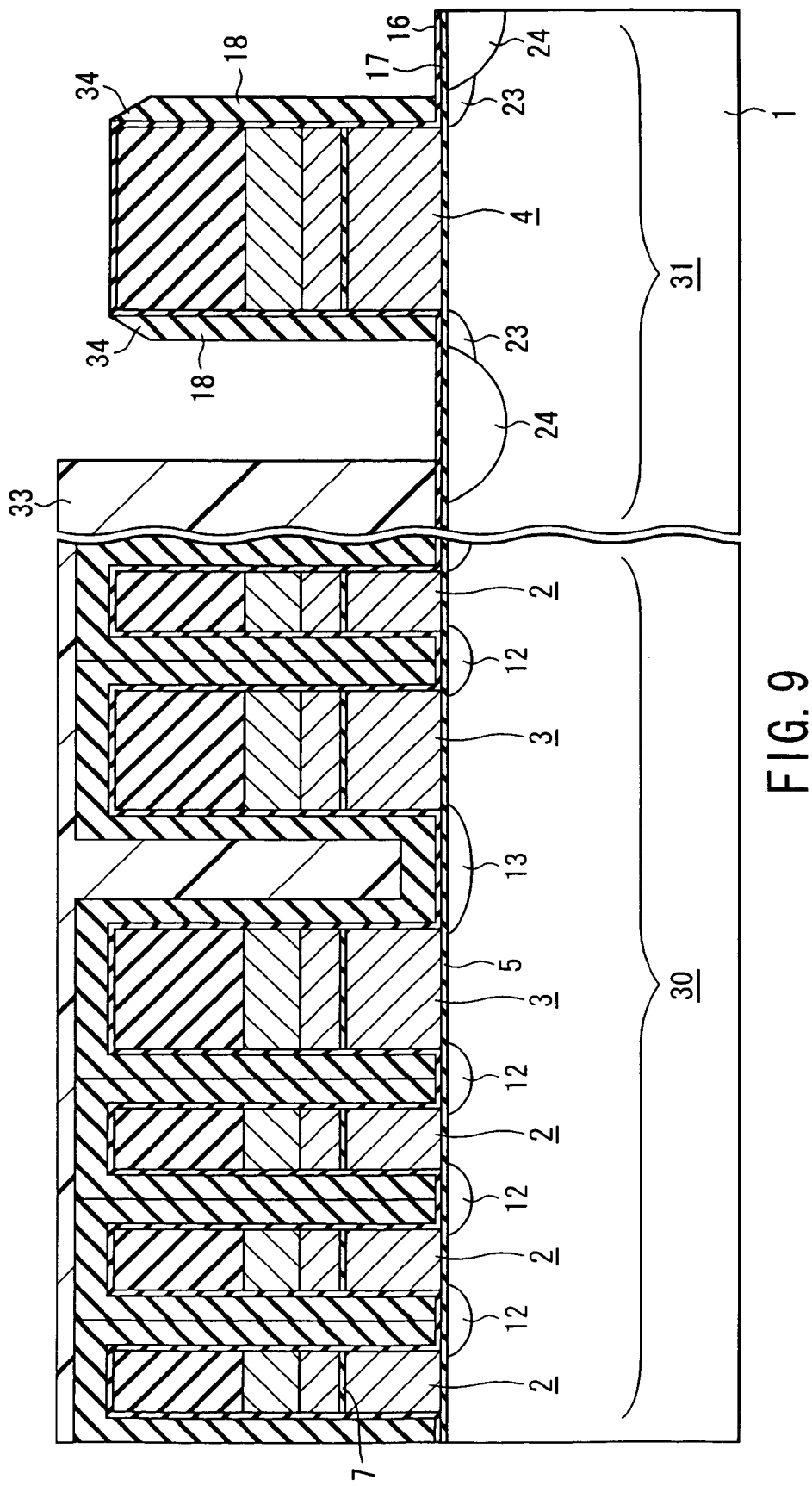
FIGS. 9 to 12 are sectional views showing a step following that of FIG. 8A in a stepwise manner.

Subsequently, as shown in FIG. 9, the memory cell portion 30 is covered with a mask material 33, and the first insulation film 18 formed in the upper part of the peripheral gate 4 and the first insulation film 18 formed on the upper surface of the semiconductor substrate 1 are removed by reactive ion etching (RIE) in the peripheral circuit portion 31. At this time, a tapered portion 34 is formed in the first insulation film 18 in the sidewall upper part. Thereafter, the mask material 33 is removed.

Next, the first insulation film 18 around the peripheral gate 4 is used as a mask to implant ions into the semiconductor substrate 1, so that the heavily-doped diffusion layer 24 including LDD structure is formed. When the impurity concentration of the heavily-doped diffusion layer 24 is raised by a considerable degree, the high-speed operation of the peripheral transistor is possible.

Furthermore, simultaneously with the forming of the heavily-doped diffusion layer 24, the first insulation film 18 around the peripheral gate 4 is used as a mask to implant the ions obliquely into the semiconductor substrate 1, and a channel impurity region (not shown) may partially be formed in the semiconductor substrate 1 so as to be in contact with the lightly-doped diffusion layer 23 under the peripheral gate 4. When the channel impurity region is formed, the impurity concentration to be implanted is set to be lower than an ion concentration of impurities for forming the heavily-doped diffusion layer 24, and the heavily-doped diffusion layer 24 is prevented from being removed.

Figure 10:
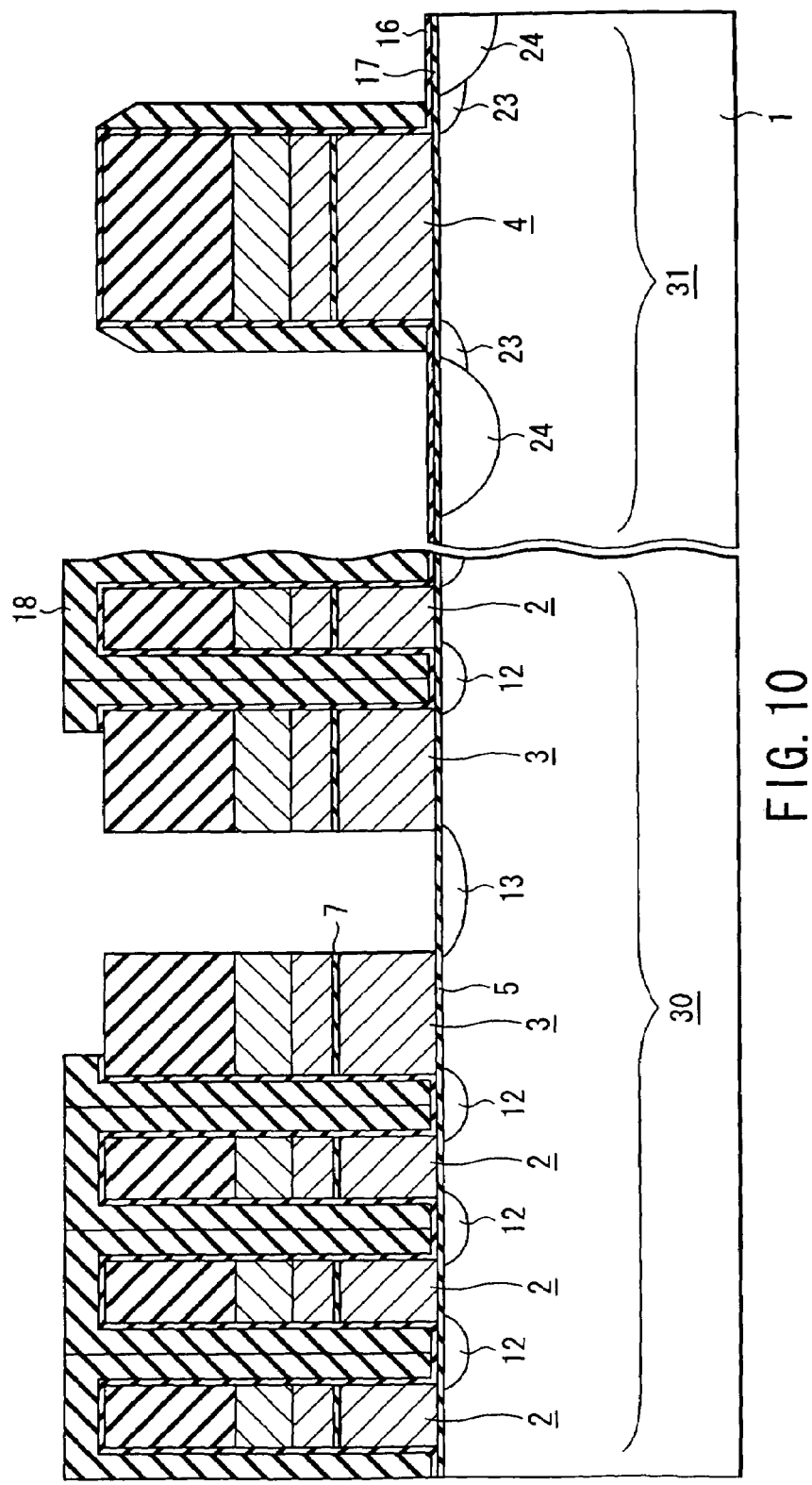

Subsequently, as shown in FIG. 10, the mask (not shown) is used to remove the first insulation film 18 between the selection gates 3 of the memory cell portion 30. Here, a large part of the first insulation film 18 formed on the upper surface of the selection gate 3 is removed, and only a part of the upper surface on the side adjacent to the memory cell gate 2 remains.

Figure 11:
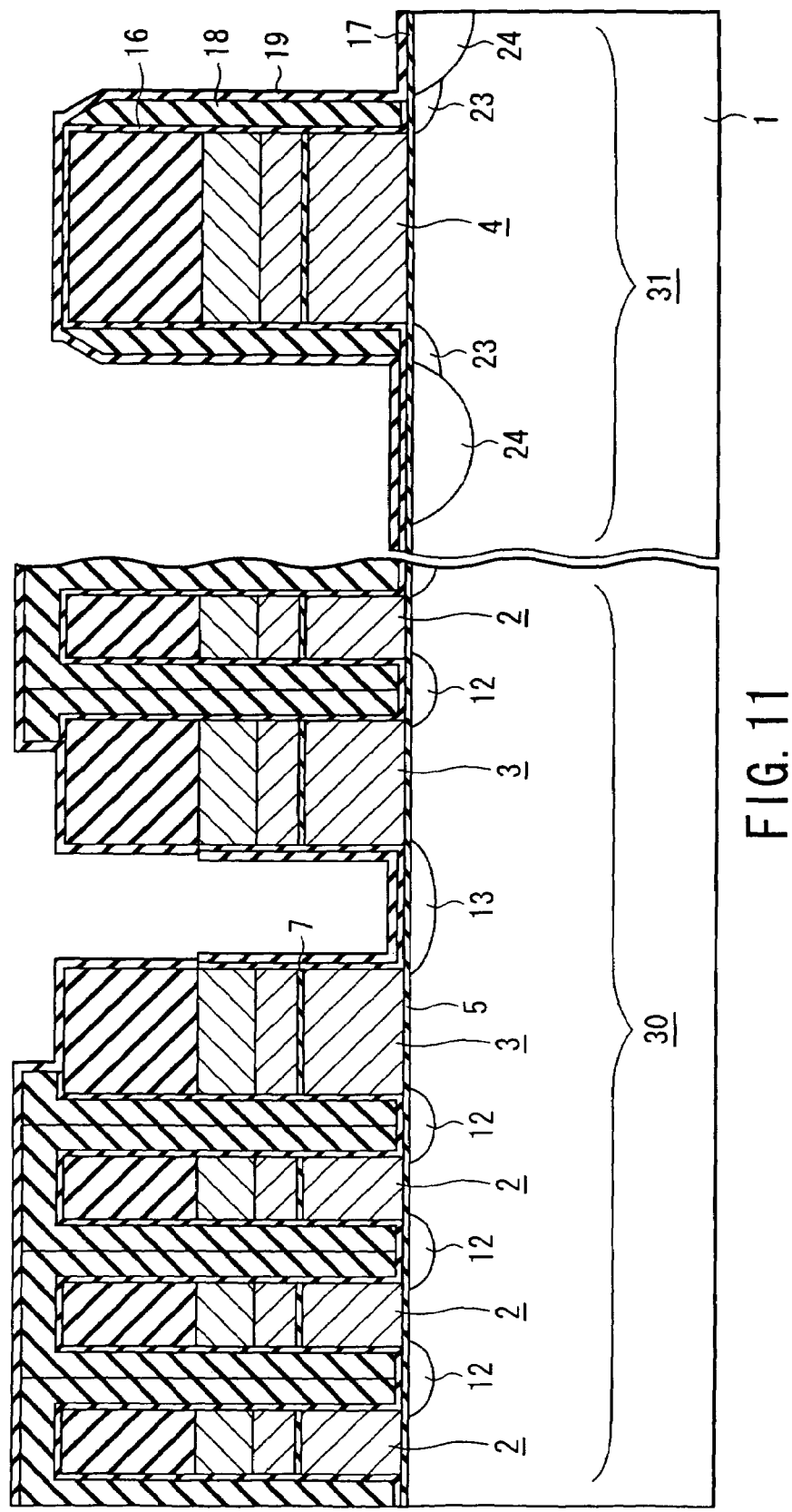

Subsequently, as shown in FIG. 11, the second insulation film 19 is formed over the whole exposed surface. Here, as the second insulation film 19, a film is used which has etching tolerance against the etching for opening the bit line contact hole. For example, to use the silicon oxide film as the interlayer insulator (first interlayer insulator 20 described later) in which the contact hole is formed, the silicon nitride film is used as the second insulation film 19.

Figure 12:
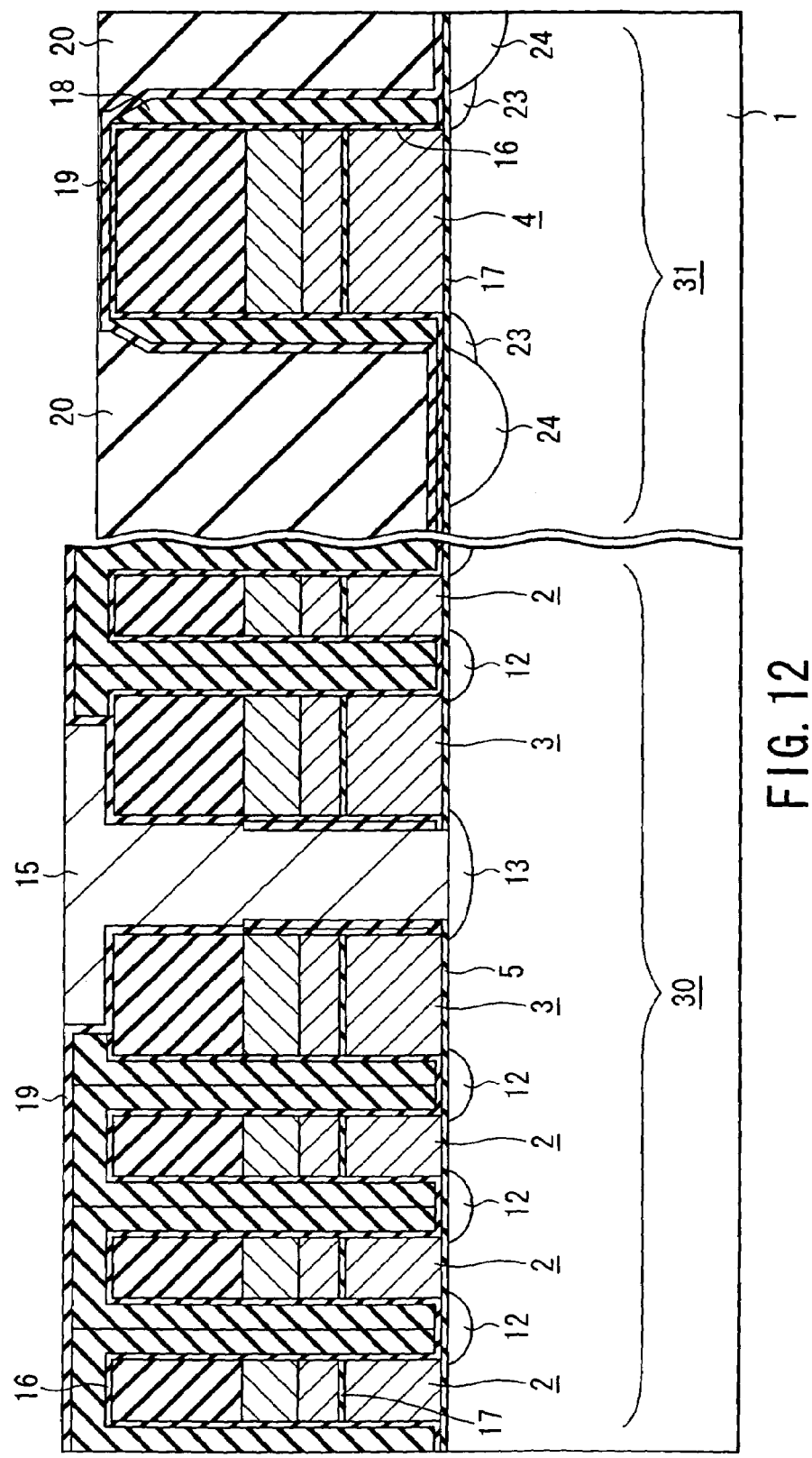

Next, as shown in FIG. 12, the first interlayer insulator 20 including, for example, BPSG, BSG, and TEOS films are deposited. Thereafter, thermal treatment is applied to fluidize the first interlayer insulator 20 followed by flattening the first interlayer insulator 20 by CMP method, and the first interlayer insulator 20 fills between the selection gates 3 and around the peripheral gate 4. When CMP is used, CMP having selectivity to the second insulation film 19 is used to stop polishing on the second insulation film 19. Another method shown in FIG. 8B may be adopted as aforementioned.

In this case, the first insulation film 18 fills between the memory cell gates 2 of the memory cell portion 30, and the first insulation film 18 needs to exist in the end of each memory cell unit. Additionally, the seam (air gap) may also be generated. Moreover, the topmost portion of the first insulation film 18 may drop to a position lower than the height of the gate mask material 11 of the memory cell gate 2. Alternatively, even with the seam entering the first insulation film 18 between the memory cell gates 2, there is no problem as long as the seam does not contact the semiconductor substrate 1.

Subsequently, the first interlayer insulator 20 (not shown) between the selection gates 3 is removed, and the contact hole for bit line contact is opened. After opening the bit line contact hole reaching the second insulation film 19, an etching is performed to the second insulation film 19, the first insulation film 18 and gate oxide film 5. Thereby, the bit line contact hole is completely opened on the bit line contact diffusion layer 13.

Next, for example, the conductive material such as polycrystal silicon doped with impurities is filled in the bit line contact hole as shown in FIG. 12, and the bit line contact 15 is formed.

Subsequently, the second interlayer insulator 21 is deposited on the exposed surface as shown in FIG. 4. Next, the contact hole (not shown) for making a contact to the source/drain diffusion layer of the peripheral portion is formed, and contact materials such as metal and low-resistance semiconductor are formed on the second interlayer insulator 21 so as to form the bit line 22 and fill the contact hole to form the bit line contact 15 connecting to the bit line 22, so that the semiconductor device is obtained.

Moreover, the following method may be used as a modification. The contact hole for making the contact is formed in the source/drain diffusion layers of the peripheral portion. The contact material such as the metal or low-resistance semiconductor is formed on the second interlayer insulator 21 in such a manner that the bit line contact 15 and the bit line 22 connecting to the bit line contact 15 are simultaneously formed.

According to the present embodiment, the flatting of the first interlayer insulator 20 by CMP is stopped at the second insulation film 19, and thereby controllability of the film thickness of the second interlayer insulator 21 formed later can be enhanced. Alternatively, even by a flatting method in which selectivity is imparted to the SiN mask material 11 on each gate, an interlayer insulator structure similarly having uniformity is possible.

As described above, according to the present embodiment, in the NAND type flash memory, the interval between the adjacent selection gates 3 is larger than that between the memory cell gates 2. Only the silicon oxide film fills between the memory cell gates 2, and the silicon nitride film is formed on the opposite sidewalls between the selection gates 3. Simultaneously with the forming of the silicon oxide film and silicon nitride film of the memory cell region 30, the silicon oxide film and a protective film by the silicon nitride film are formed on the sidewall of the peripheral gate 4 of the peripheral region 31. As described above, while a process for realizing high reliability and yield of the memory cell is executed, the peripheral transistor can simultaneously be formed with good efficiency.

In the present embodiment, since the second insulation film 19 has tolerance against the etching of the first interlayer insulator 20, the etching for forming the contact hole can once be stopped on the second insulation film 19.

Moreover, when the silicon nitride film is used as the second insulation film 19, a function of preventing boron, phosphorous, and carbon included in the first interlayer insulator 20 from being diffused into the semiconductor substrate 1 can also be achieved. When the impurities are diffused into the semiconductor substrate 1, the fluctuation and dispersion of the device characteristics are generated. However, since diffusion coefficient of the impurities in the silicon nitride film is remarkably small, the silicon nitride film can block the diffusion of the impurities.

Furthermore, according to the present embodiment, since the silicon nitride film functions as the stopper at the etching of the bit line contact formed between the selection gates, in high-integration semiconductor devices, the bit line contact can be formed with good controllability, and adverse influence by hydrogen onto transistor characteristics can be prevented. As a result, the high reliability and yield of the semiconductor device can be realized.

Moreover, the silicon nitride film is not formed between the memory cell gates, the fluctuation of cell characteristics by the trapping of electrons into the silicon nitride film can be prevented. Moreover, only the silicon oxide film is filled between the memory cell gates, dielectric constant between the word lines drops, and cell interference can be reduced.

It is to be noted that the gate electrode is not limited to a four-layers structure, and three or more than four layers structure may also be used. At least the floating gate is formed on the gate insulation film, the inter-gate insulation film is formed on the gate, and further a control gate is formed thereon. It is to be noted, the respective gate insulation films may also be formed in different thicknesses in the memory cell gate, selection gate, and peripheral gate. Particularly when the thickness of the gate insulation film of the peripheral gate is formed to be larger than that of the gate insulation film of another portion, a high withstanding voltage transistor can be formed in the peripheral portion.

Second Embodiment

Figure 13:
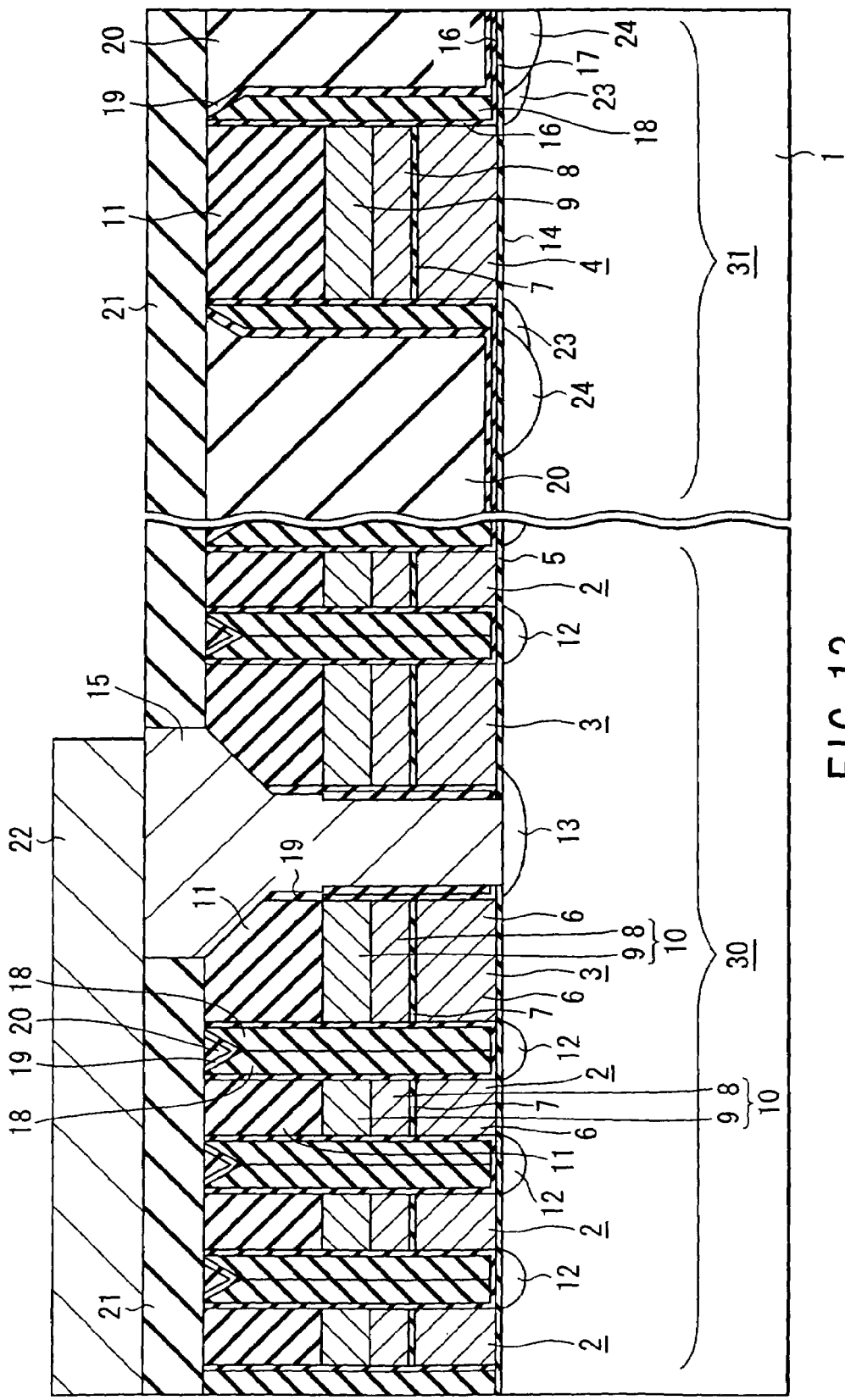
FIG. 13 is a sectional view along a bit line of the semiconductor device according to a second embodiment.

The semiconductor device of a second embodiment includes a configuration similar to the first embodiment excluding the following respects. That is, the shape of the first insulation film 18, the structure of the SiN layer 11 around the bit line contact 15 of the selection gate 3 are different from those of the first embodiment. As shown in FIG. 13, the upper portion of the first insulation film 18 filled between the memory cell gates 2 is removed in a V-shape. The second insulation film 19 is similarly formed in the V-shape on the removed depression. The upper part of the first interlayer insulator 20 is flatted and formed on the second insulation film 19.

Furthermore, the first insulation film 18 is not disposed on the memory cell gate 2 and selection gate 3, and the second interlayer insulator 21 is directly formed on these gates. Additionally, in the surface of the selection gate 3 disposed opposite to the bit line contact 15, the upper part of the SiN layer 11 of the uppermost layer is partially removed in a tapered shape. Therefore, the bit line contact 15 contacts the SiN layer 11 as the gate mask material with a relatively large area. The semiconductor device formed in this manner provides an effect similar to that of the first embodiment.

Figure 14:
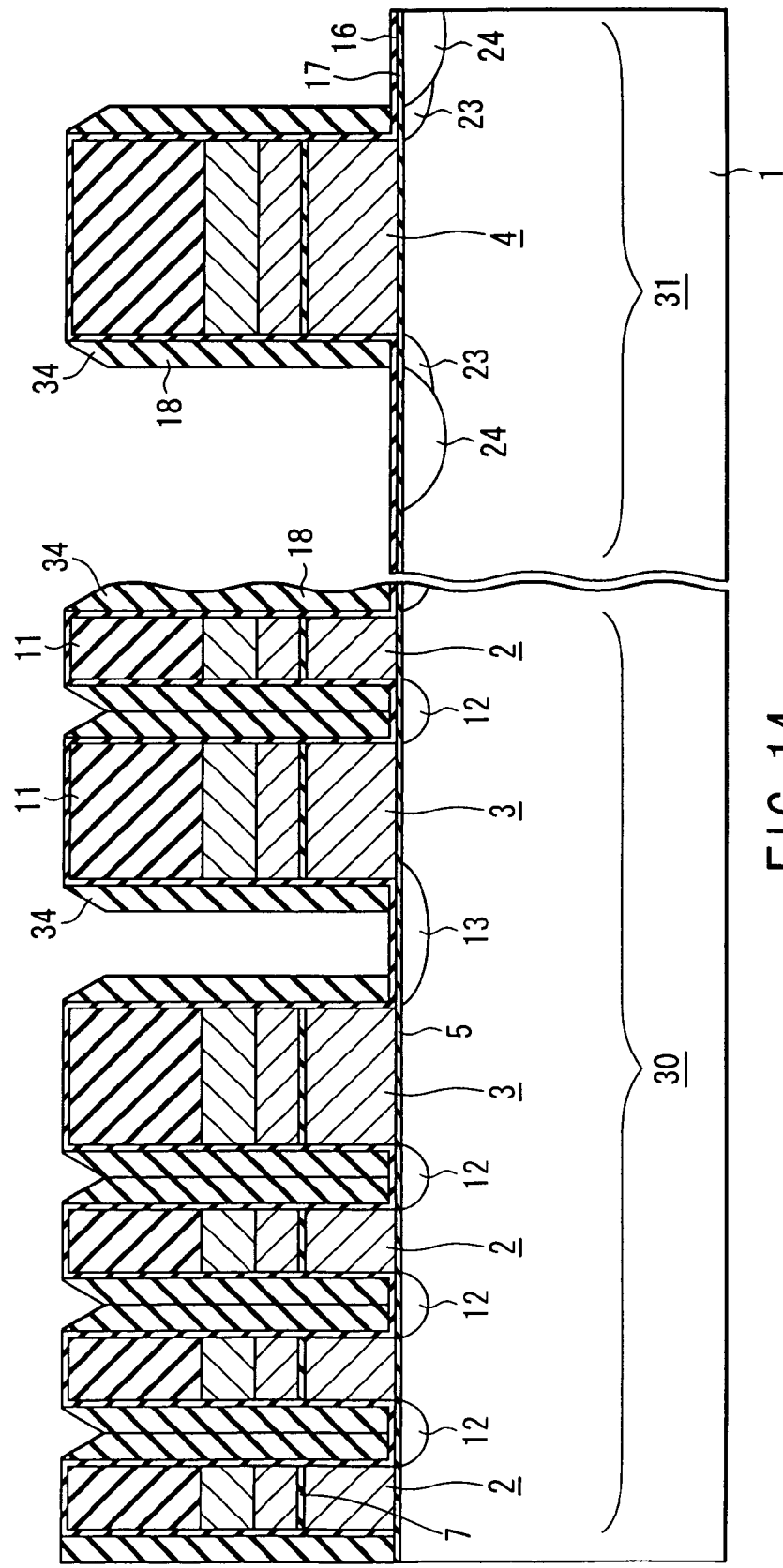
FIGS. 14 to 17 are sectional views showing the manufacturing method of the semiconductor device according to the second embodiment in the stepwise manner.

The manufacturing method of the semiconductor device of the present embodiment will next be described. First, similarly to the first embodiment, manufacturing steps shown in FIGS. 7 and 8A are carried out. Thereafter, as shown in FIG. 14, in the peripheral circuit portion 31, anisotropic etching (RIE) is performed to remove the first insulation film 18 formed in the upper part of the peripheral gate 4, and the tapered portion 34 is formed in the upper part of the sidewall. Additionally, the first insulation film 18 on the semiconductor substrate 1 of the peripheral portion 31 is also removed.

At this time, also in the memory cell portion 30, the first insulation film 18 formed in the upper parts of the memory cell gate 2 and selection gate 3 is etched to remove the first insulation film 18 from the upper surface of the memory cell gate 2, and the tapered portion 34 is formed on the sidewall upper part.

In this case, as the first insulation film 18, a film including little hydrogen content and few traps with the charges is suitable. Usable examples of the film include a silicon oxide film, oxynitride film, and the like.

Figure 15:
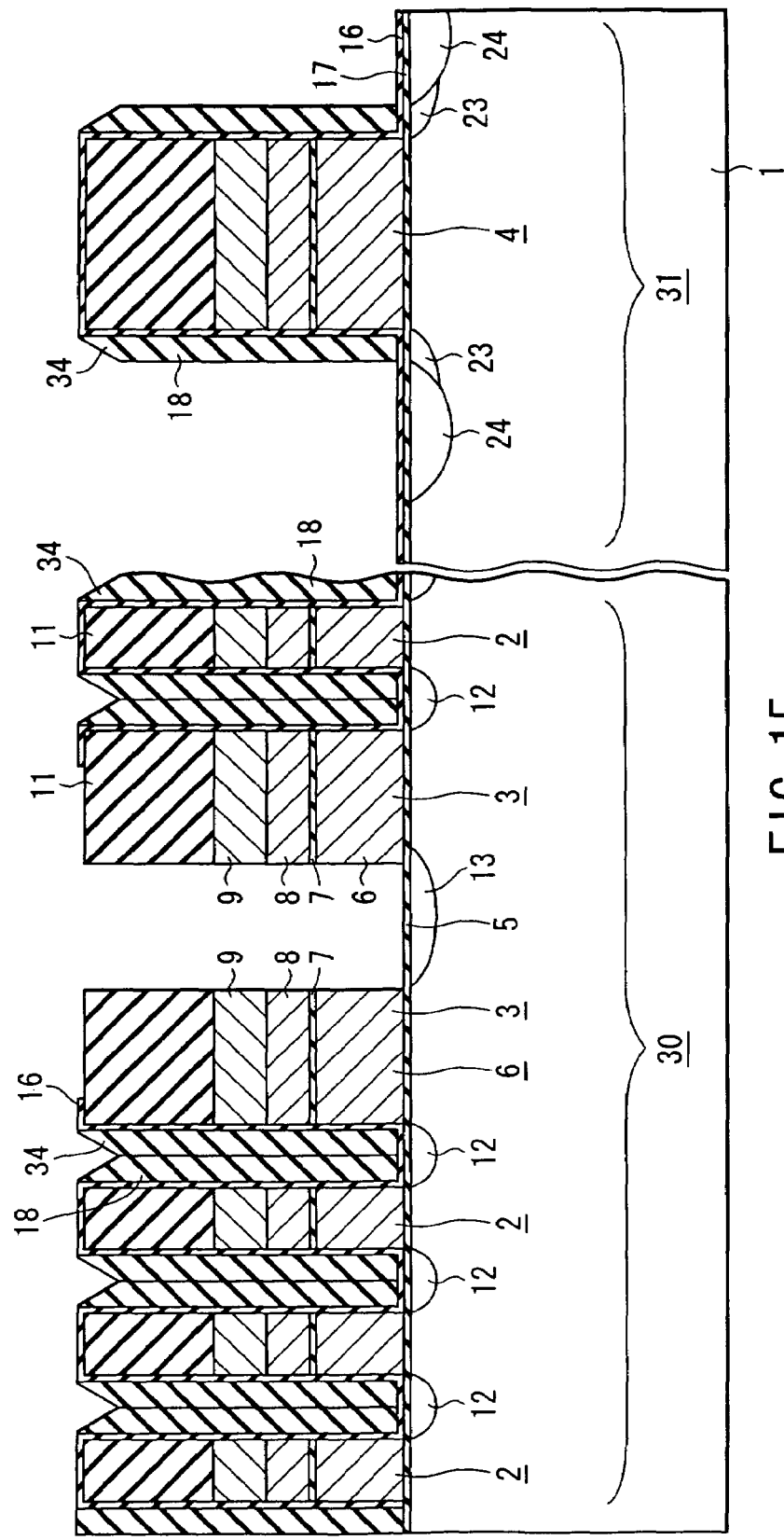

Subsequently, as shown in FIG. 15, in the memory cell portion 30, by lithography using the etching mask (not shown) to expose the contact hole forming part between the selection gates 3, the first insulation film 18 between the selection gates 3 disposed adjacent to each other and the post oxide film 16 of the sidewall are removed. Thereby, the upper surface of the diffusion layer 13 and the side surface of the selection gate 3 are exposed between the selection gates 3. At this time, a large part of the post oxide film 16 not covered with the etching mask on the gate mask material 11 is removed on the diffusion layer 13 side.

Figure 16:
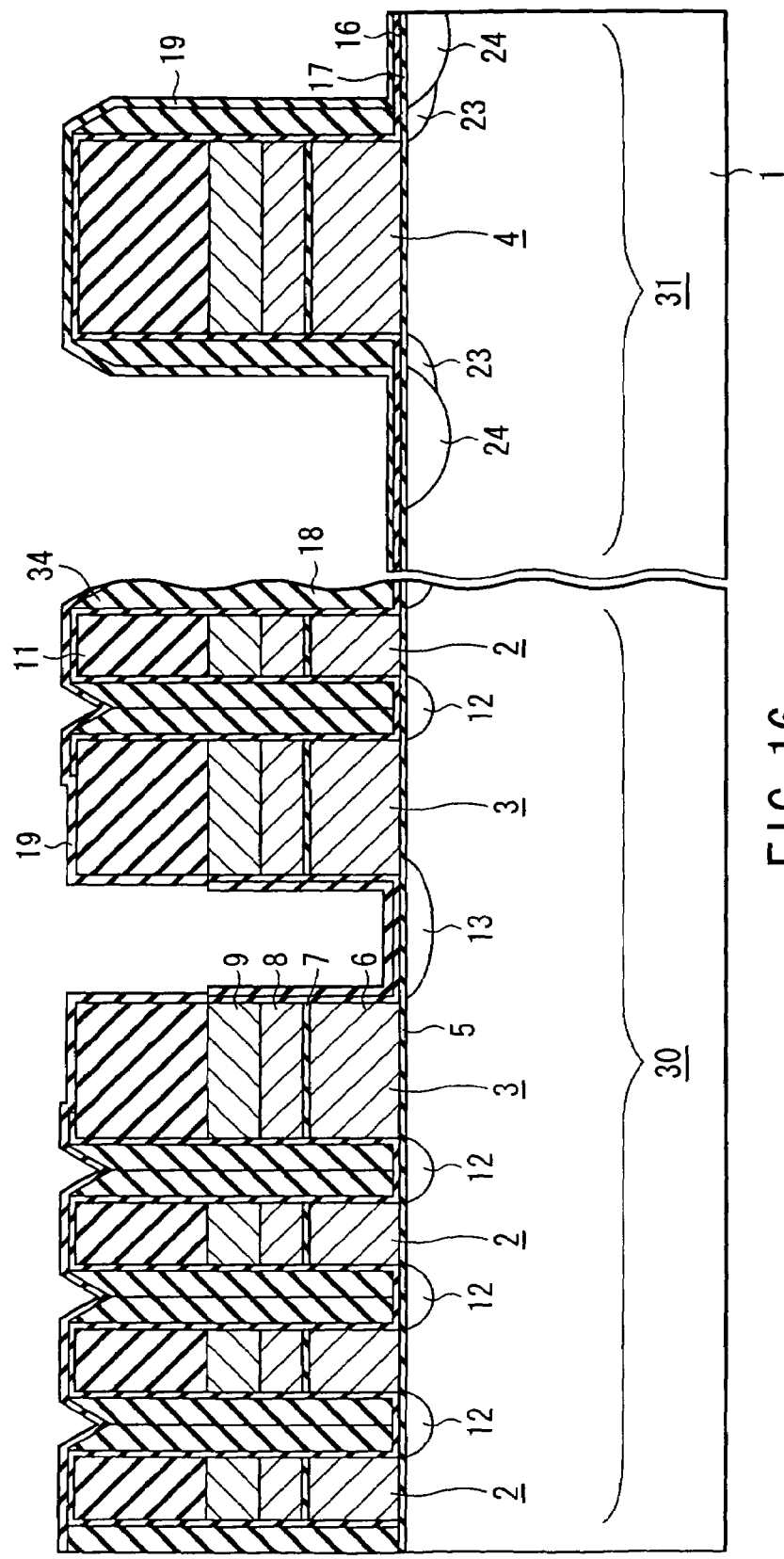

Next, as shown in FIG. 16, the second insulation film 19 including a silicon nitride material as the main component is formed over the whole exposed surface.

Figure 17:
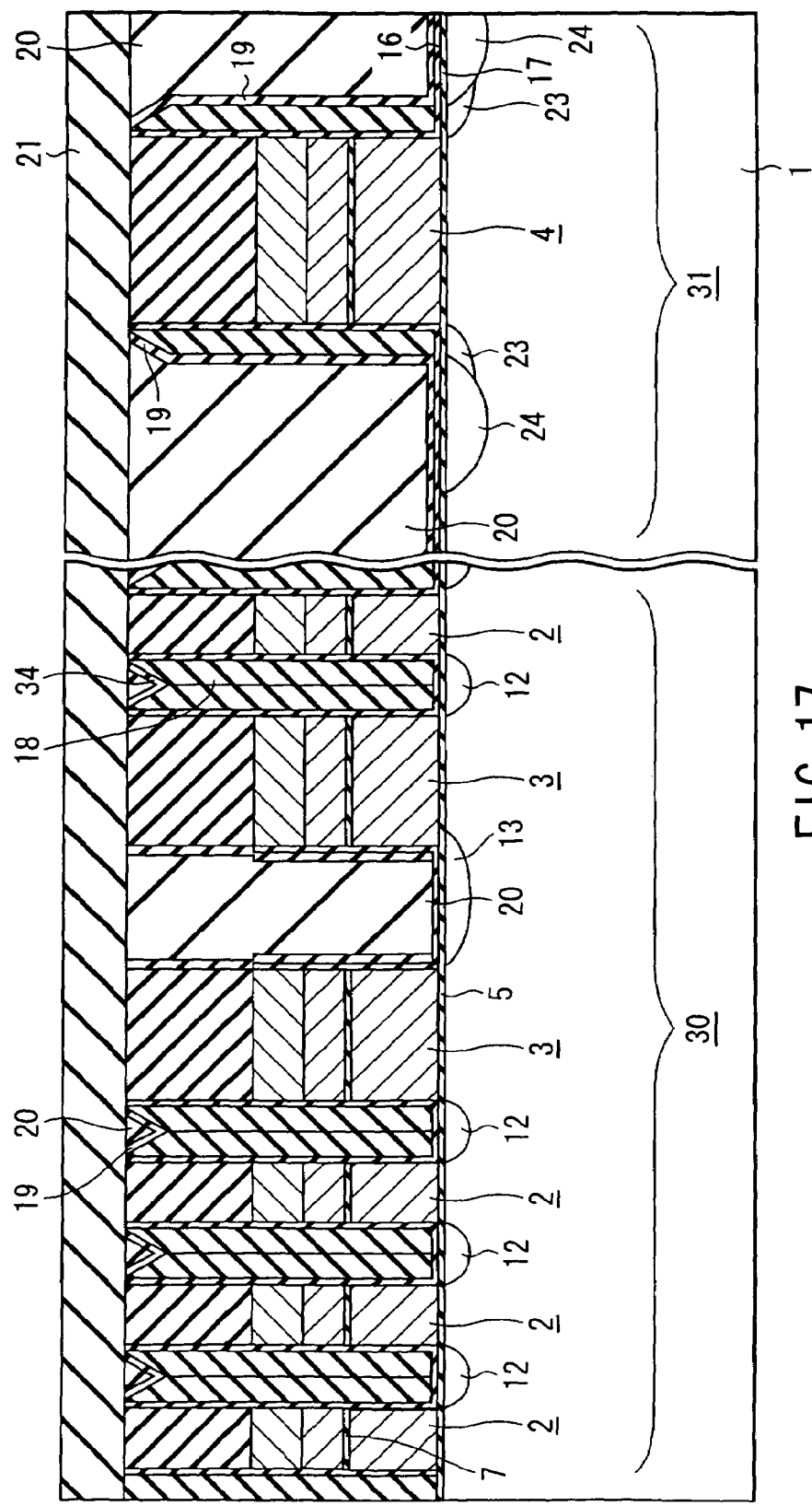

Subsequently, as shown in FIG. 17, the BSG, BPSG, or TEOS film is used on the exposed surface to form the first interlayer insulator 20 so that the film fills between the selection gates 3 and around the peripheral gate 4. Next the second insulation film 19 is used as the mask to flat the upper surface of the first interlayer insulator 20 by the CMP method so that the position of the upper surface agrees with that of the upper surface of the second insulation film 19 on the selection gate 3 and peripheral gate 4. Next the second insulation film 19 of the exposed surface is removed. Thereafter, the second interlayer insulator 21 including BPSG or TEOS is formed on the exposed surface.

Subsequently, as shown in FIG. 13, an opening is formed between the selection gates 3, the conductive film is filled to form the bit line contact 15, and the bit line 22 is formed on the second interlayer insulator so as to be connected to the bit line contact 15, so that the semiconductor device is completed.

In the present embodiment, there is no step of covering the memory cell portion with the mask to etch the peripheral portion as in the first embodiment, and therefore the number of manufacturing steps can be reduced as compared with the first embodiment.

Third Embodiment

Figure 18:
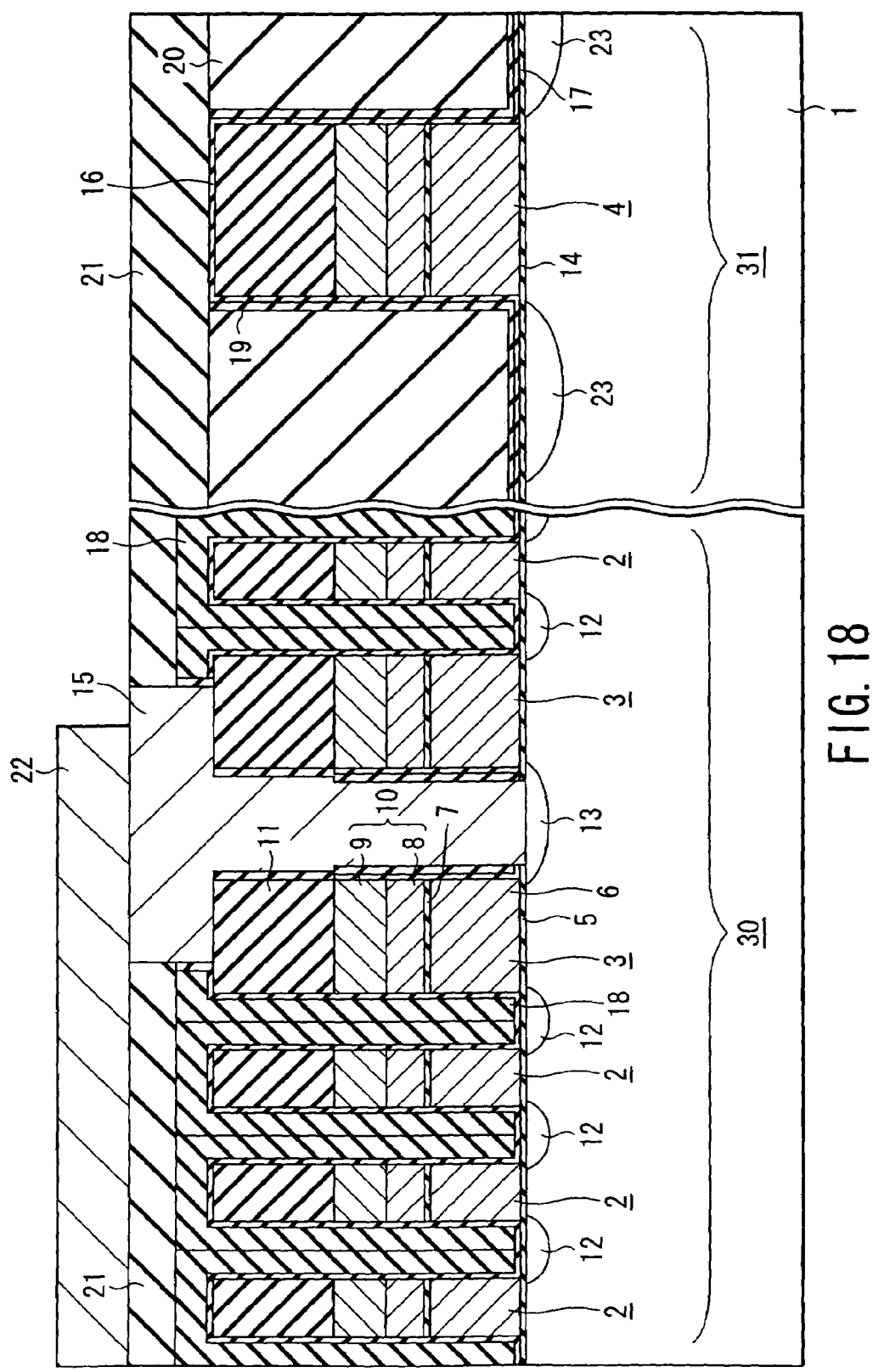
FIG. 18 is a sectional view along the bit line of the semiconductor device according to a third embodiment.

The semiconductor device of a third embodiment includes a configuration similar to that of the first embodiment excluding the following respects. That is, as shown in FIG. 18, the structure is different from that of the semiconductor device of the first embodiment in that the first insulation film 18 is not disposed around the peripheral gate 4. The second insulation film 19 is disposed on the side surface of the peripheral gate 4 in a uniform thickness via the post oxide film 16. The semiconductor device formed in this manner provides an effect similar to that of the first embodiment.

Figure 19:
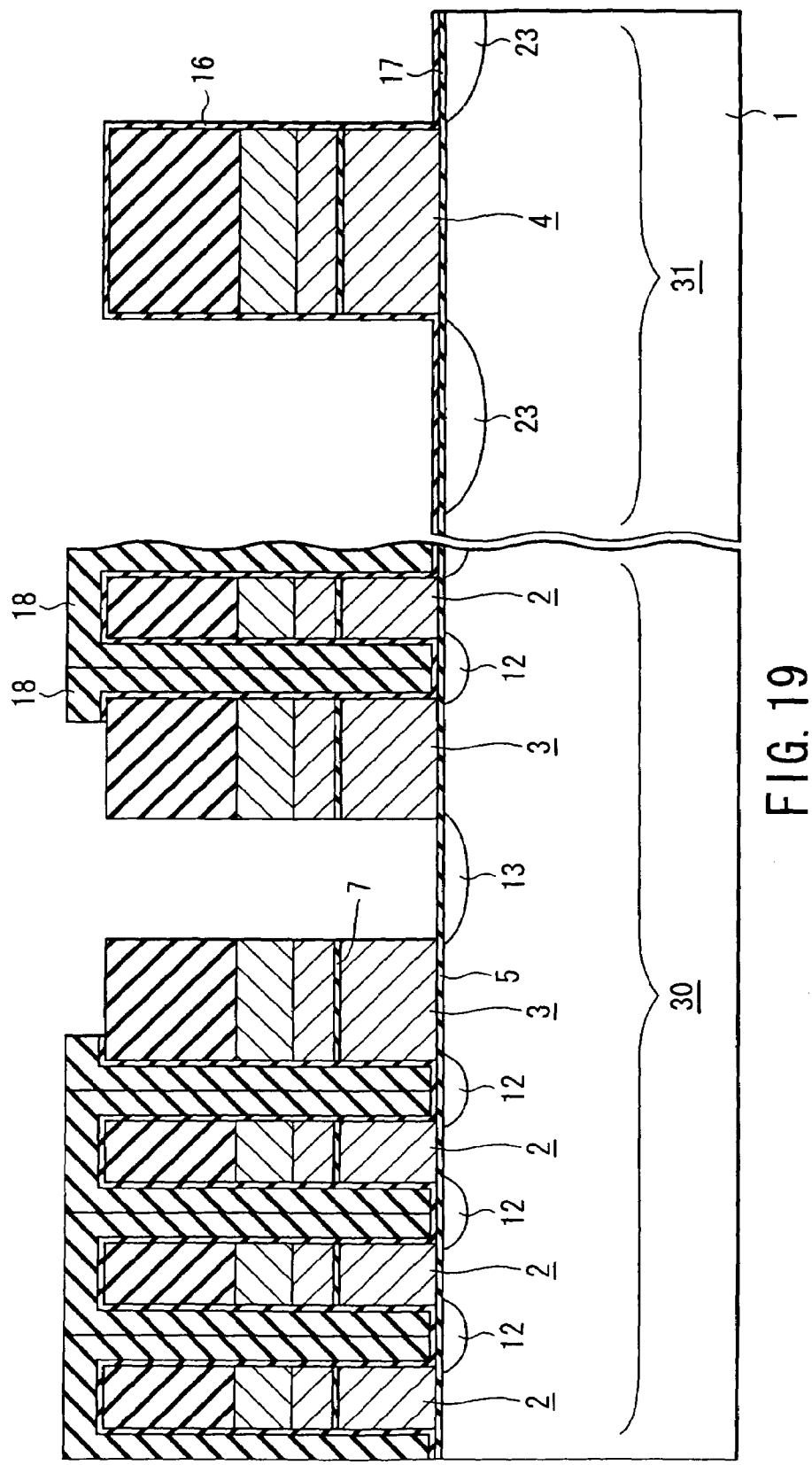
FIGS. 19 to 21 are sectional views showing the manufacturing method of the semiconductor device according to a third embodiment in the stepwise manner.

The manufacturing method of the semiconductor device of the present embodiment will next be described. Similarly to the first embodiment, the manufacturing steps shown in FIGS. 7 and 8 are carried out. Thereafter, as shown in FIG. 19, in the peripheral circuit portion 31, all the first insulation film 18 around the peripheral gate 4 is etched, and the first insulation film 18 is all removed from the surface of the peripheral gate 4. Moreover, the first insulation film 18 on the semiconductor substrate 1 of the peripheral circuit portion 31 is removed.

Furthermore, in the memory cell portion 30, the etching mask (not shown) for exposing the contact hole forming region is used to etch and remove the first insulation film 18 from the side surfaces disposed opposite to each other between the selection gates 3 disposed adjacent to each other and a part of the upper surface of the selection gate 3. Furthermore, the first insulation film 18 on the diffusion layer 13 is also simultaneously removed.

In this case, the film including little hydrogen content and few traps with respect to the charges is suitable for the first insulation film 18. Usable examples include the silicon oxide film and oxynitride film.

Figure 20:
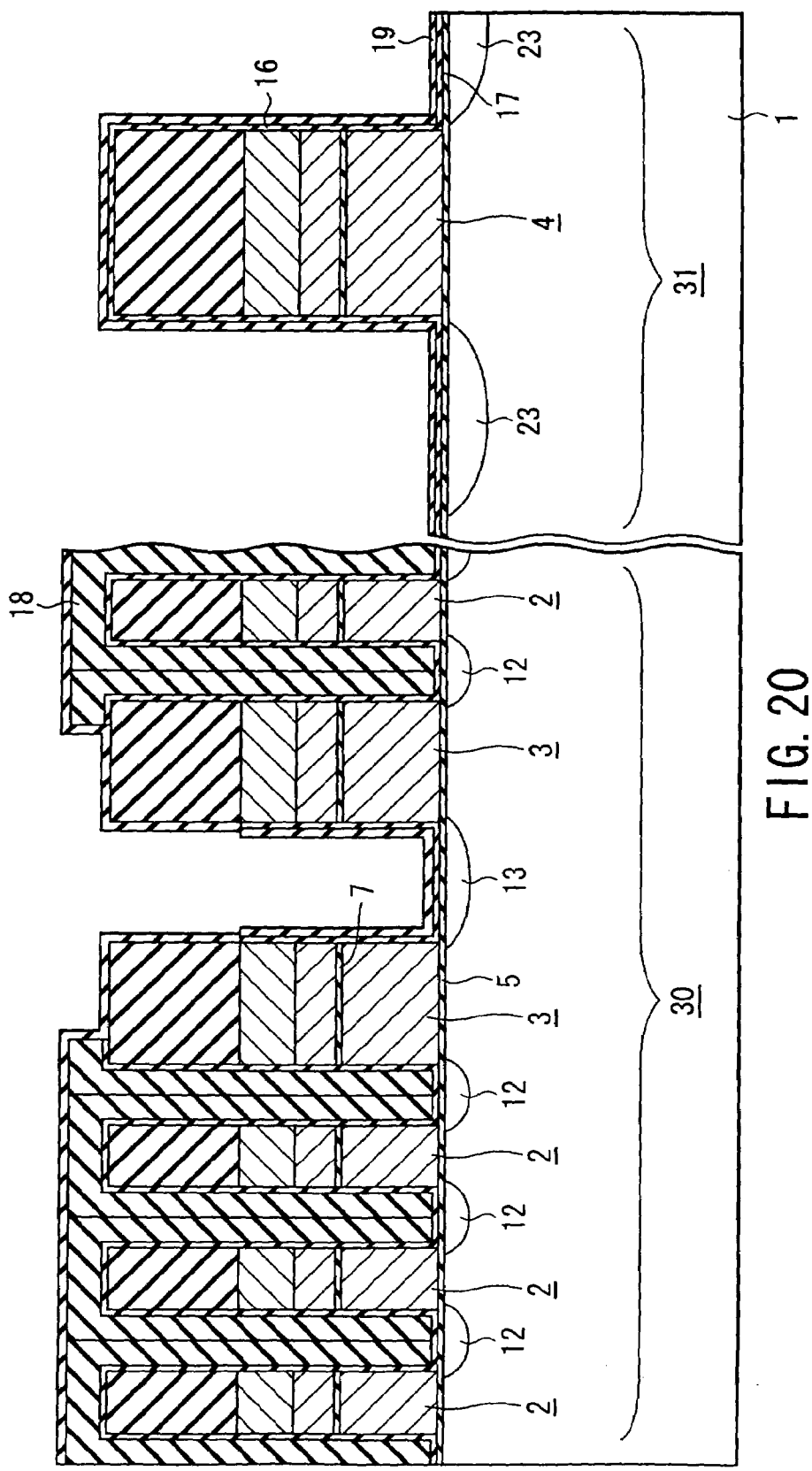

Subsequently, as shown in FIG. 20, the second insulation film 19 including silicon nitride as the main component is formed over the whole exposed surface.

Figure 21:
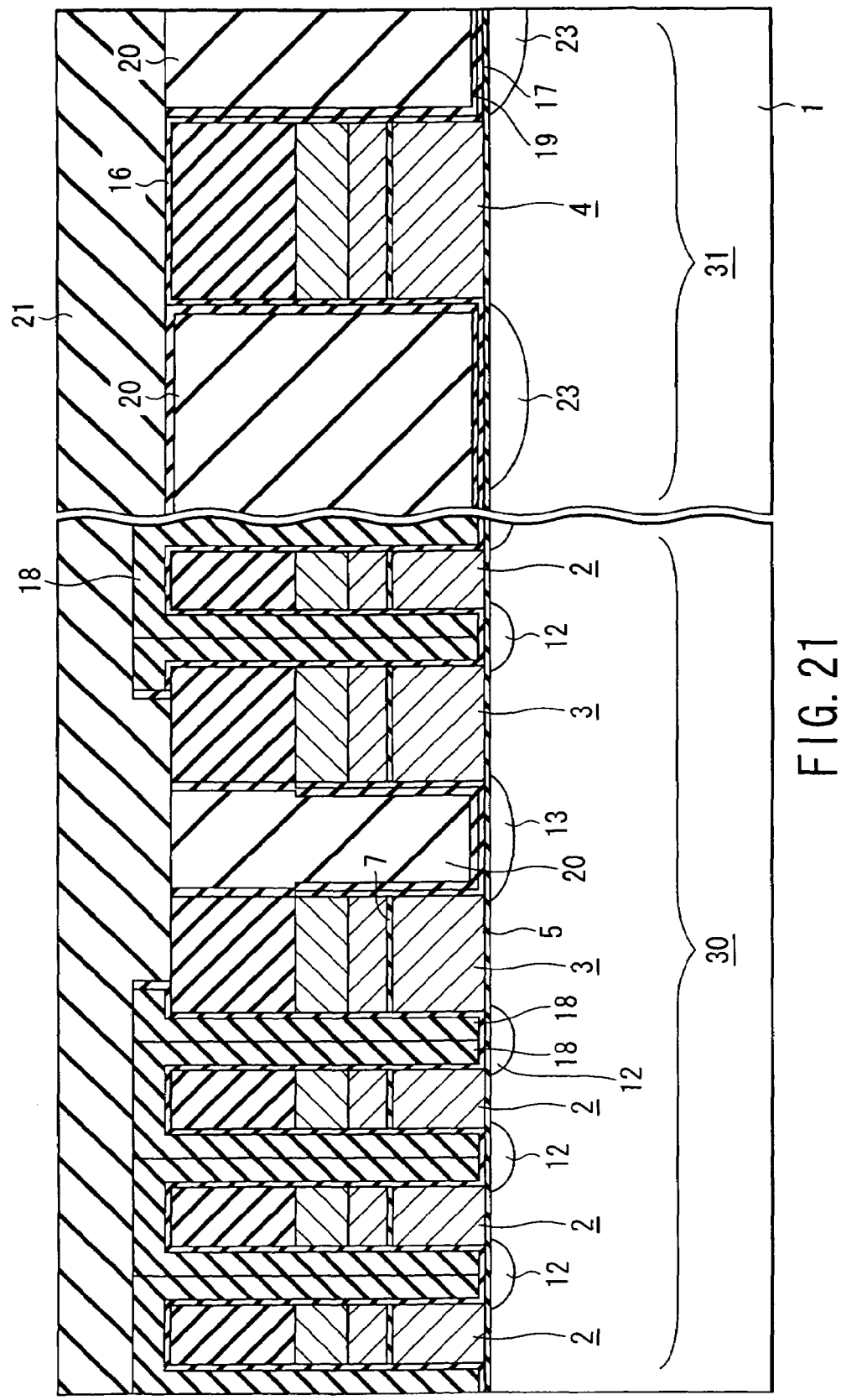

Subsequently, as shown in FIG. 21, the TEOS film is used on the exposed surface to form the first interlayer insulator 20 so that the film fills between the selection gates 3 and around the peripheral gate 4. Thereafter, the second insulation film 19 is used as the mask to flat the upper surface of the first interlayer insulator 20 by the CMP method so that the position of the upper surface agrees with that of the upper surface of the second insulation film 19 on the peripheral gate 4 or the memory cell gate 2. Next the second insulation film 19 of the exposed surface is removed, and the second interlayer insulator 21 including BPSG is formed on the exposed surface.

Subsequently, as shown in FIG. 18, the contact hole is opened between the selection gates 3, and the conductive film is filled to form the bit line contact 15. The bit line 22 is formed on the second interlayer insulator 21 so that the bit line contact 15 is connected, and the semiconductor device is obtained.

In the present embodiment, there is no step of covering the memory cell portion with the mask to etch the peripheral portion as in the first embodiment, and therefore the number of manufacturing steps can be reduced as compared with the first embodiment.

Even in this configuration, an effect similar to that of the first embodiment can be obtained. It is to be noted that in the present embodiment the presence of the silicon nitride film on the gate end of the peripheral portion is apprehensive of the deterioration of the characteristics, but there is no problem if the application is limited.

In the above-described first to third embodiments, there may be voids in the first insulation film 18 which fills among the memory cell gates 2 and between the memory cell gate 2 and selection gate 3. Even with the voids, unless the voids reach the upper surface of the first insulation film 18, the effect of the present invention is therefore unchanged, because the second insulation film 19 is not filled between the gate electrodes of the memory cell transistor.

According to the above-described respective embodiments, a thick oxide film fills between the gates of the memory cell transistor, and the peripheral circuit portion and memory cell portion are simultaneously manufactured, so that the number of manufacturing steps can be reduced.

The present invention can appropriately be implemented in combination in addition to the above-described embodiments. That is, the above-described respective embodiments can be applied to any structure in which a plurality of gates are connected in series and there is no contact between the gates. The above-described respective embodiments are preferable particularly for a nonvolatile semiconductor memory device which includes a contact having little dimensional allowance with respect to the element region and in which a strong electric stress for passing the tunnel current is applied to the gate oxide film.

Figure 22:
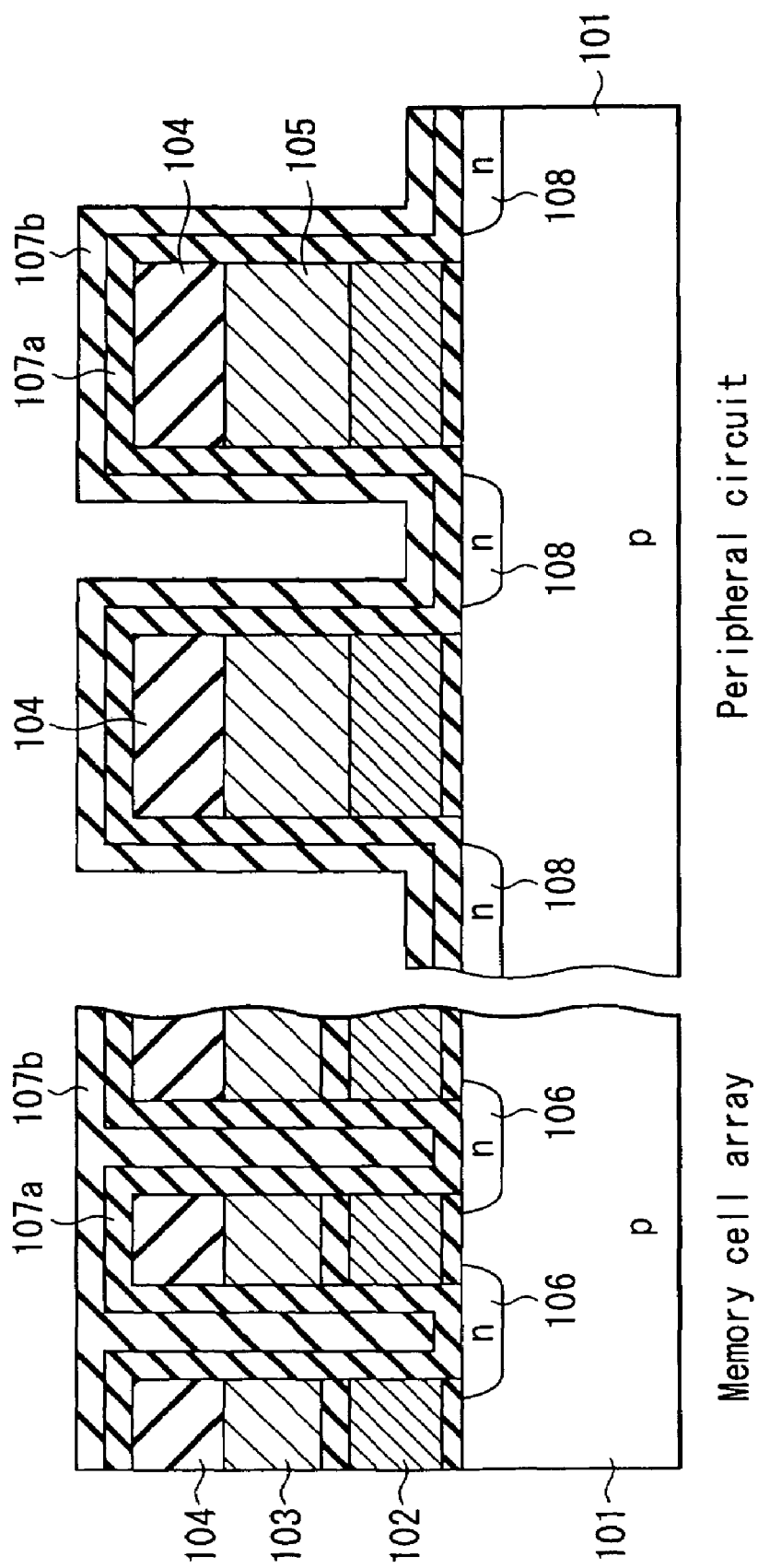
FIG. 22 is a sectional view showing a gate offset of the prior-art NAND type EEPROM.

Incidentally, when the size/space of the peripheral circuit transistor is reduced with capacity enlargement and function enhancement of the NAND type EEPROM, some problems are caused even in the peripheral circuit. This will concretely be described with reference to FIG. 22. FIG. 22 shows that the major part of the device is formed in a common process with respect to the region of the NAND cell unit (cell array region) and peripheral circuit region.

In this example, the memory cell gate portion of the NAND cell unit includes the stacked structure including a floating gate electrode 102 formed on a silicon substrate 101 via a tunnel insulation film, and a control gate electrode 103 formed on the gate electrode via an inter-gate insulation film. This gate portion is formed with the silicon nitride film 104 as the gate mask material mounted thereon.

A gate electrode 105 of the peripheral circuit has a stacked structure of double-layer polycrystal silicon films including the floating gate electrode 102 of the memory cell gate and control gate electrode 103, and is also patterned in a state covered with the silicon nitride film 104.

On the memory cell gate side, after the gate portion is patterned, ions are implanted and source/drain diffusion layers 106 are formed. Thereafter, between the gate portions of the memory cell gate, a first insulation film (silicon oxide film) 107a and second insulation film (silicon nitride or oxide film) 107b are deposited and filled substantially flatly. In the peripheral circuit, the first and second insulation films 107a and 107b are deposited simultaneously with the deposition on the cell array side. Thereafter, the ion implantation is performed, and source and drain diffusion layers 108 are formed.

Additionally, in a state in which the double layers of the insulation films 107a and 107b are formed on the gate electrode side surface of the peripheral circuit, as shown in FIG. 22, there is a possibility of the offset gate in which tips of the source and drain diffusion layers 108 formed by the ion implantation do not come under the gate electrode 105. Moreover, when the interval between the gate electrodes decreases, it is difficult to form the diffusion layer between the gate electrodes and it is further difficult to make a wiring contact.

To avoid the offset gate, for example, similarly to the source and drain diffusion layers 106 on the memory cell gate side, it is considered that the ion implantation is performed before depositing the first and second insulation films 107a and 107b, and the lightly-doped source and drain diffusion layers are formed. However, even in this case, it is still difficult to form the heavily-doped source and drain diffusion layers and wiring contact.

Moreover, for the transistor of the peripheral circuit, it is sometimes necessary to implant channel ions using oblique ion implantation for threshold value control before or after the step of forming the source and drain diffusion layers. In the state in which the gate electrode interval is narrowed and the double-layer insulation films 107a and 107b are formed on the gate electrode side surface as shown in FIG. 22, such channel ion implantation is also difficult.

Fourth to sixth embodiments described hereinafter have been developed in consideration of the above-described circumstance, and there are provided a semiconductor device and manufacturing method in which the density of the peripheral circuit transistor can be raised.

Fourth Embodiment

Figure 23A:
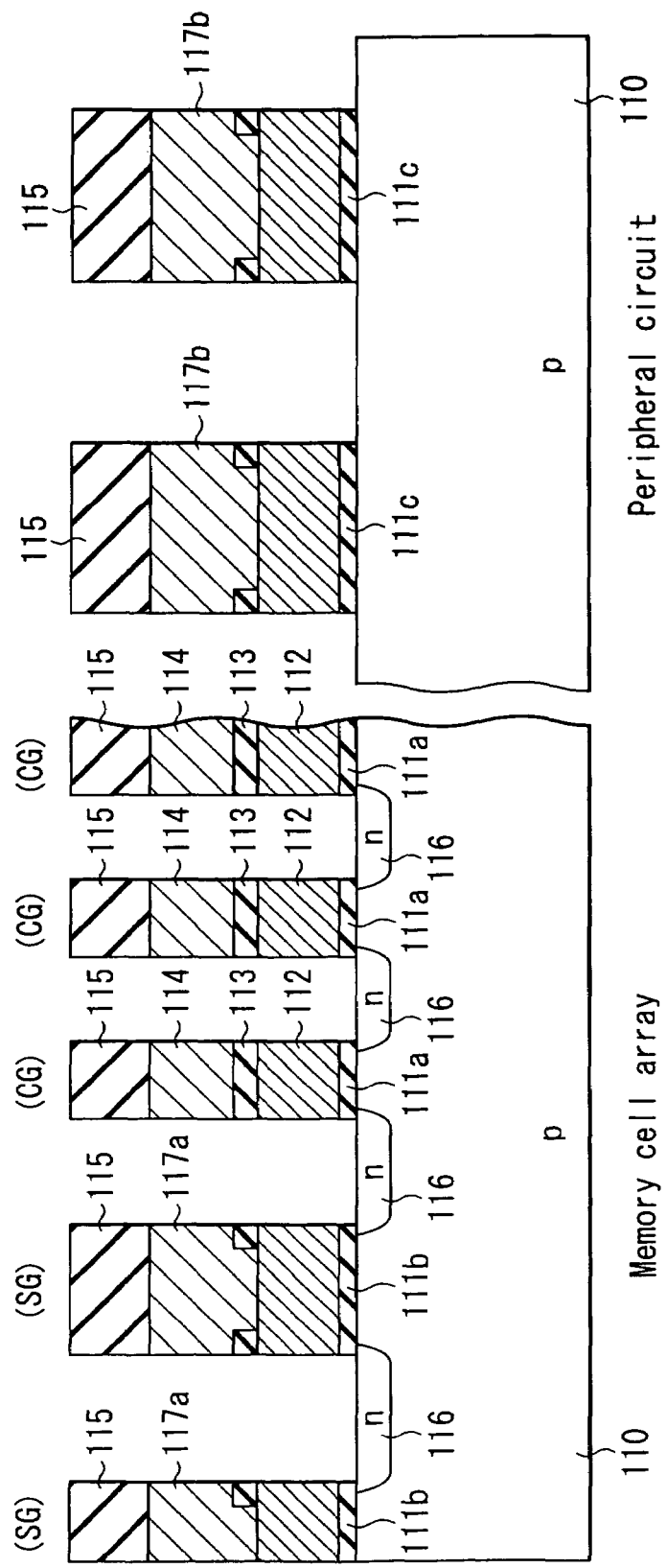
FIG. 23A is a sectional view along the bit line showing steps including gate electrode formation of the semiconductor device according to a fourth embodiment.
Figure 23B:
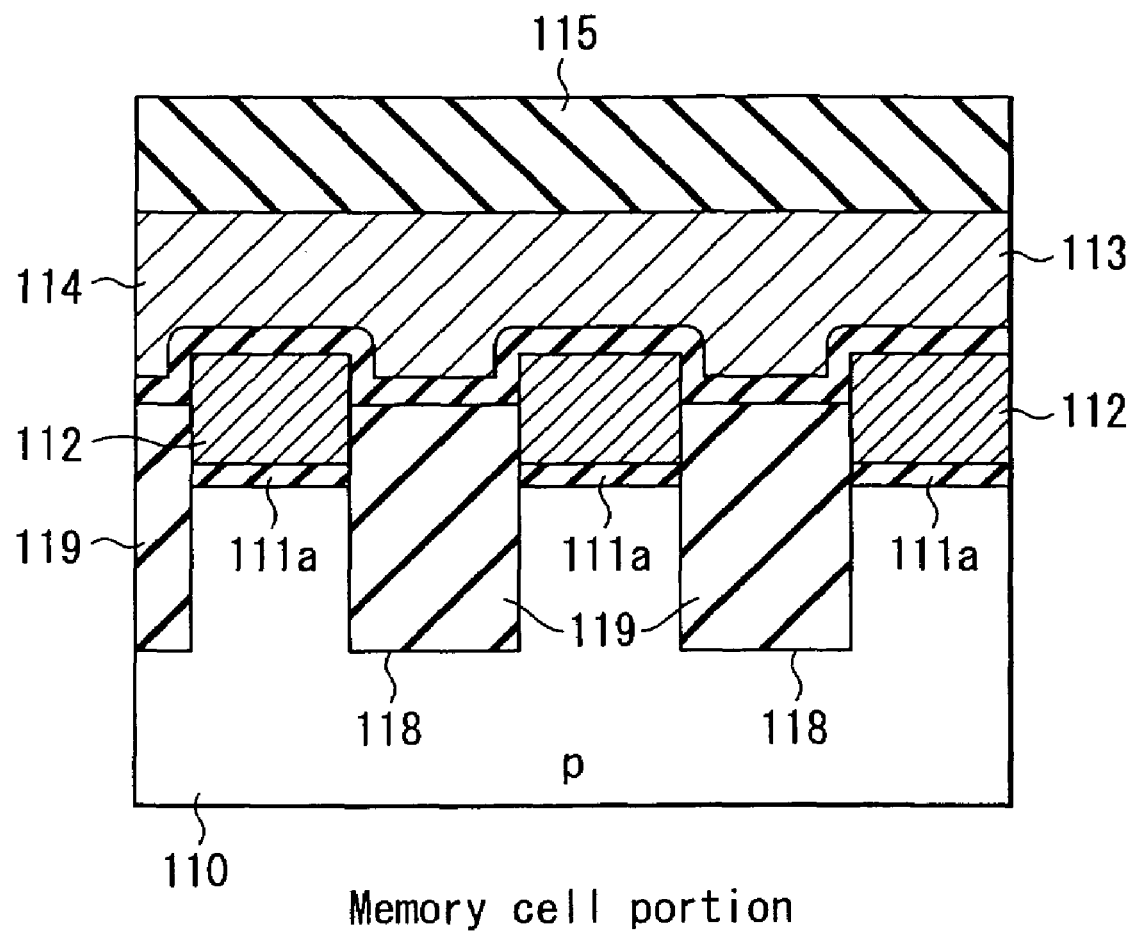
FIG. 23B is a sectional view along a word line of the semiconductor device of the fourth embodiment.

FIGS. 23A and 23B to 30 are sectional views showing manufacturing steps of the semiconductor device (NAND type EEPROM) according to a fourth embodiment in a stepwise manner. FIG. 23B is a sectional view along the word line, and other drawings are sectional views along the bit line.

FIGS. 23A and 23B show that the gate portion (gate portion CG of the memory cell, and gate portion SG of the selection gate transistors on the bit line and source line sides) of the NAND cell unit is formed on a silicon substrate 110, and a gate electrode 117 of the peripheral circuit region is formed. For example, the NAND cell unit includes a large number of, such as 16 and 32, memory cells and the selection gate transistors in the opposite ends of the cells. FIG. 23A shows only the vicinity of the bit line contact portion.

These steps will concretely be described with reference to FIGS. 23A and 23B. In the silicon substrate 110, necessary wells (p-type well in a NAND cell array region, and wells necessary for p-channel and n-channel regions in the peripheral circuit region) are formed, but this is omitted. Moreover, a gate insulation film 111 necessary for each device region of the silicon substrate 110 (tunnel insulation film 111a of the memory cell, gate insulation film 111b necessary for the selection gate transistor, and gate insulation film 111c necessary for the peripheral circuit transistor) is formed.

Thereafter, a first-layer polycrystal silicon film for use as a floating gate electrode 112 is deposited, mask films such as a silicon nitride film (not shown) are formed on the silicon film, and these are etched to form element isolation trenches 118. Thereby, the first-layer polycrystal silicon film is self-aligned with the element isolation region and patterns are formed so that the silicon film remains only in the element forming region. Thereafter, a silicon oxide film 119 is filled as the element isolation insulation film in the element isolation trench 118. A fill-in depth of the silicon oxide film 119 is set such that the upper surface of the oxide film is positioned halfway in the thickness of the polycrystal silicon film forming the floating gate electrode 112.

Furthermore, after removing the mask on the first-layer polycrystal silicon film, a stacked insulation film 113 of a silicon oxide film (O)/silicon nitride film (N)/silicon oxide film (O) is deposited to form the inter-gate insulation film. After etching and removing the unnecessary part of the stacked insulation film 113, that is, the selection gate transistor region of the cell array and the part of the peripheral circuit transistor region, a second-layer crystal silicon film forming a control gate electrode 114, and a silicon nitride film 115 are successively deposited. It is to be noted that the stacked insulation film 113 may be removed not only from the transistor region but also from the whole surface with respect to the peripheral circuit region.

Next these silicon nitride film 115 and double-layer polycrystal silicon film are successively etched by RIE, the floating gate electrode 112 and control gate electrode 114 of the NAND cell unit are formed, and simultaneously a gate electrode 117a of the selection gate transistor and a gate electrode 117b of the peripheral circuit transistor are formed. The gate electrode 117a of the selection gate transistor and the gate electrode 117b of the peripheral circuit are formed as the stacked structure of the double-layer polycrystal silicon film.

The gate electrode 117a of the selection gate transistor and the control gate electrode 114 of the memory cell are continuously pattern-formed as shown in FIG. 23B to form a selection gate line and word line. The gate portions SG and CG of the NAND cell array and the gate electrode 117b of the peripheral circuit are patterned and covered with the silicon nitride film 115 as described above. Thereafter, the ion implantation is performed in the NAND cell array region, and the source and drain diffusion layers 116 are formed.

Figure 24:
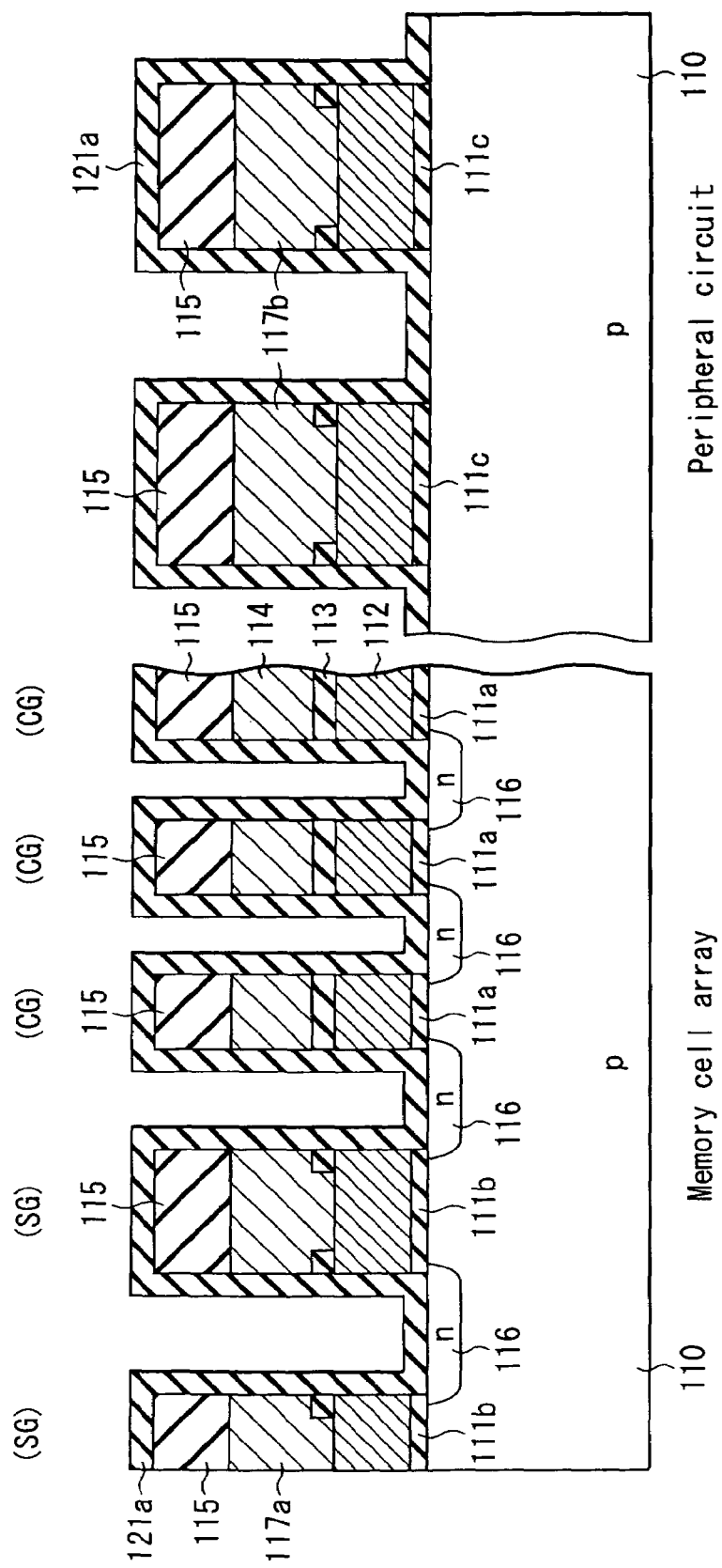
FIGS. 24 to 30 are sectional views showing the step following FIG. 23A in the stepwise manner.
Figure 25:
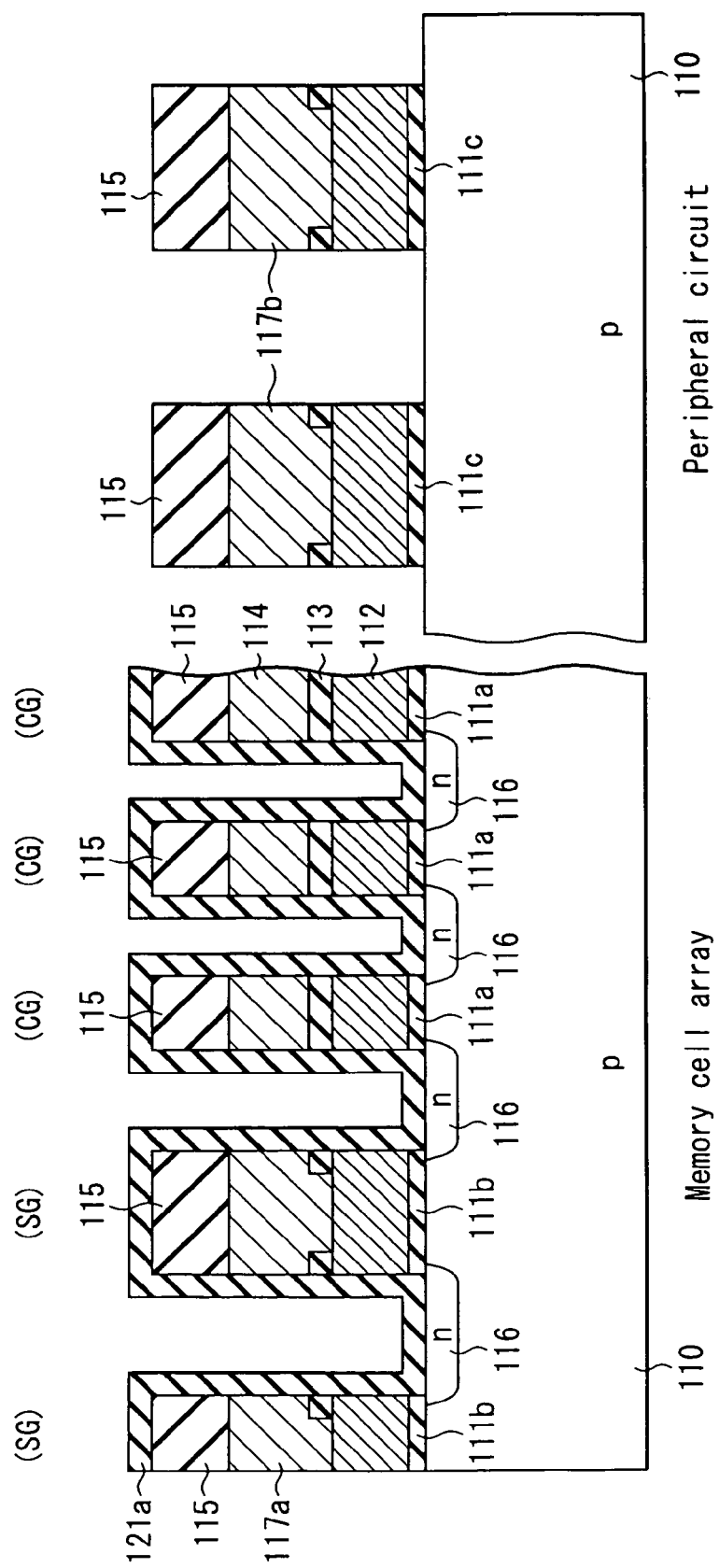

Thereafter, as shown in FIG. 24, a first silicon oxide film (first insulation film) 121a is deposited such that the regions of the NAND cell array and peripheral circuit are covered therewith. Moreover, as shown in FIG. 25, in the first silicon oxide film 121a, the region of the peripheral circuit region is etched/removed.

Figure 26:
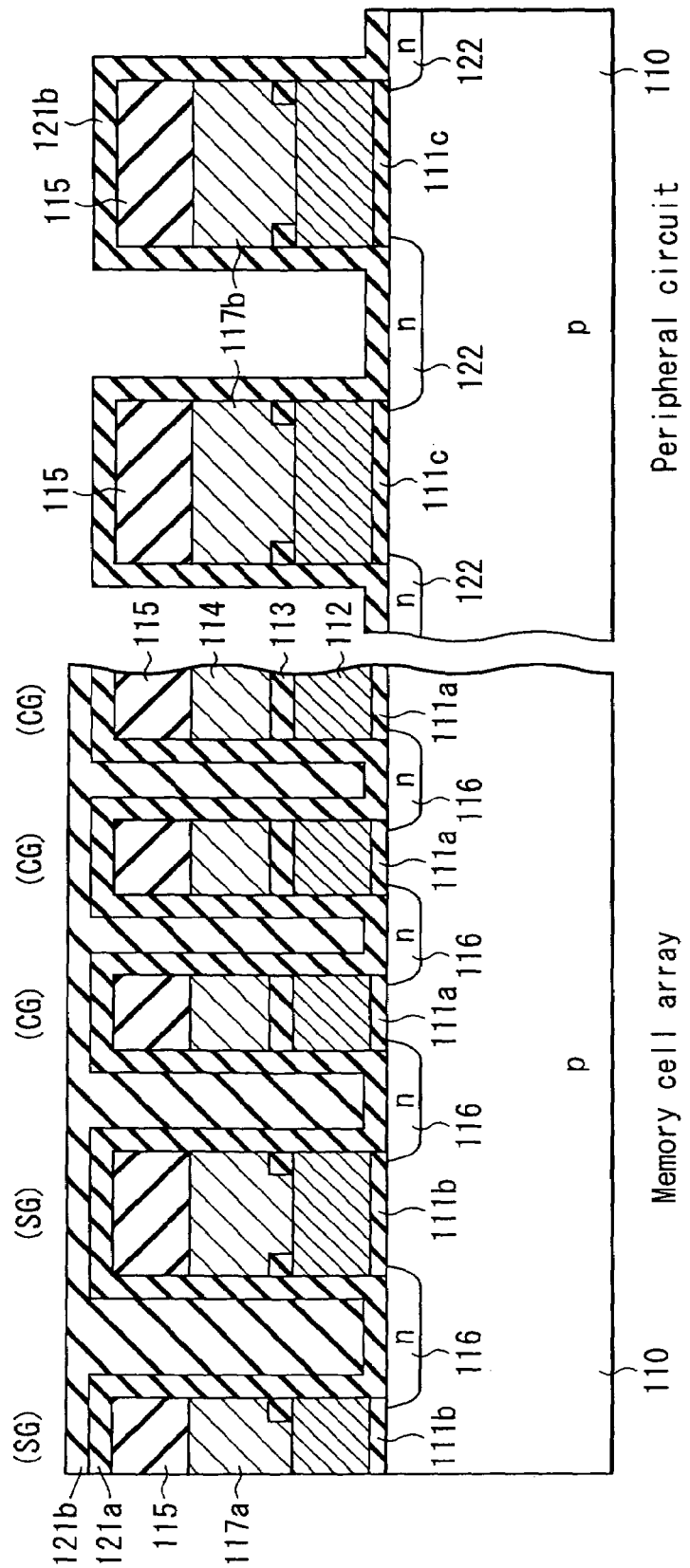
Figure 27:
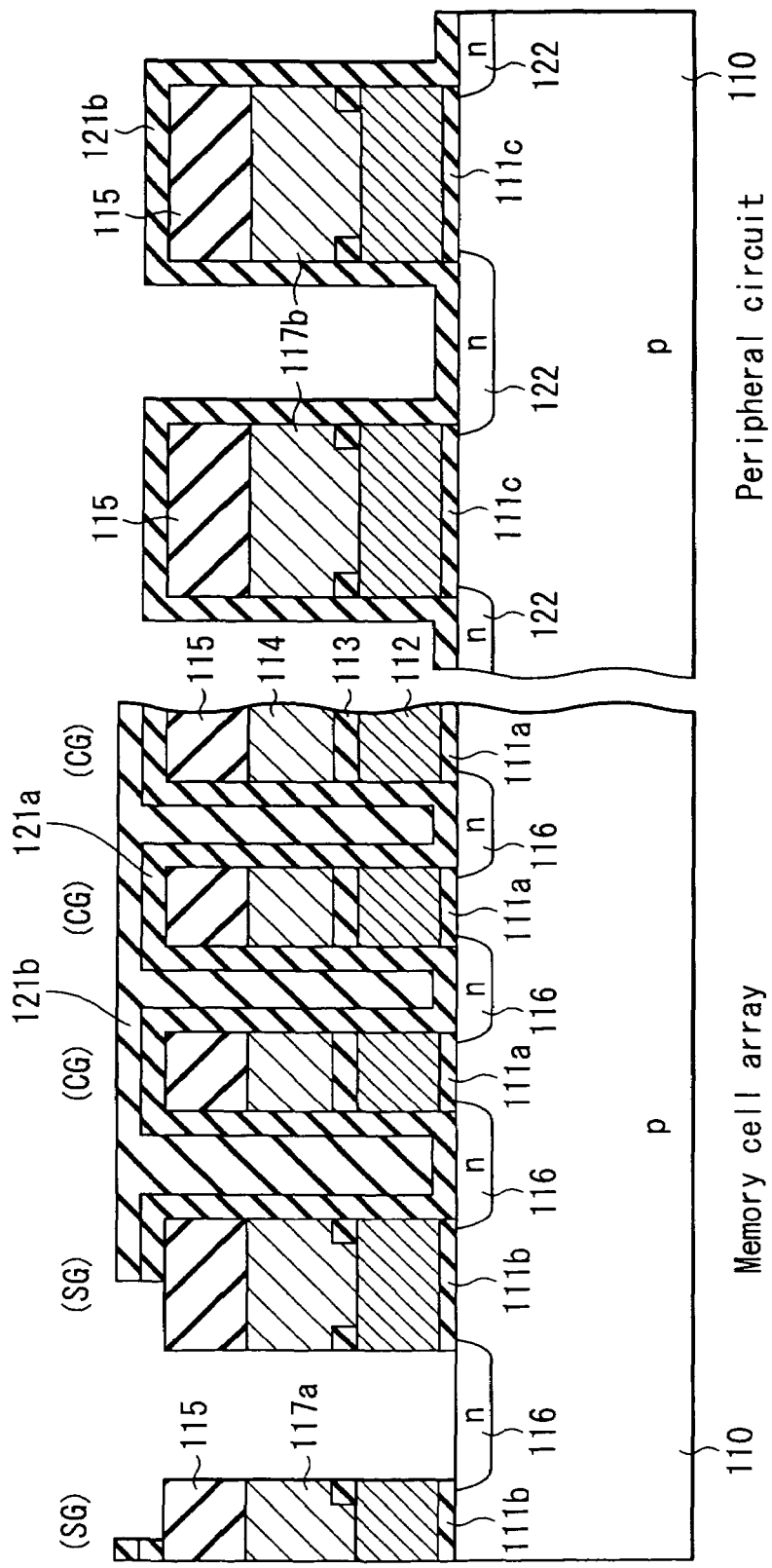

Subsequently, as shown in FIG. 26, excluding the bit line contact portion and common source line contact portion, a second silicon oxide film (second insulation film) 121b is deposited on the substrate whole surface is covered so as to flatly fill between the gate portions SG and CG of the NAND cell array. At this time, in the peripheral circuit region, the second silicon oxide film 121b lines the side surface of the gate electrode 117b, but a gap is secured between the gate electrodes.

Thereafter, in the peripheral circuit region, the ion implantation is performed to form source and drain diffusion layers 122. Though the drawings show only an n-channel MOS transistor region, p-type source and drain diffusion layers are formed in a p-channel region (not shown). Furthermore, before or after the forming of the diffusion layers 122, the channel ion implantation is performed by oblique ion implantation in order to adjust the threshold voltage of each transistor.

In the prior art, the side surface of the gate electrode 105 of the peripheral circuit has been covered with the double-layer insulation films 107a and 107b (FIG. 22). Different from this case, in the fourth embodiment, only one silicon oxide film 121b is provided, and the source and drain diffusion layers 122 are formed without any offset with respect to the gate electrode. That is, a structure in which the source or drain diffusion layer exists just under the sidewall of the gate electrode 105 is secured.

Moreover, since a sufficient ion implantation space is secured between the gate electrodes 117b, the oblique ion implantation for threshold voltage control is also facilitated.

Figure 28:
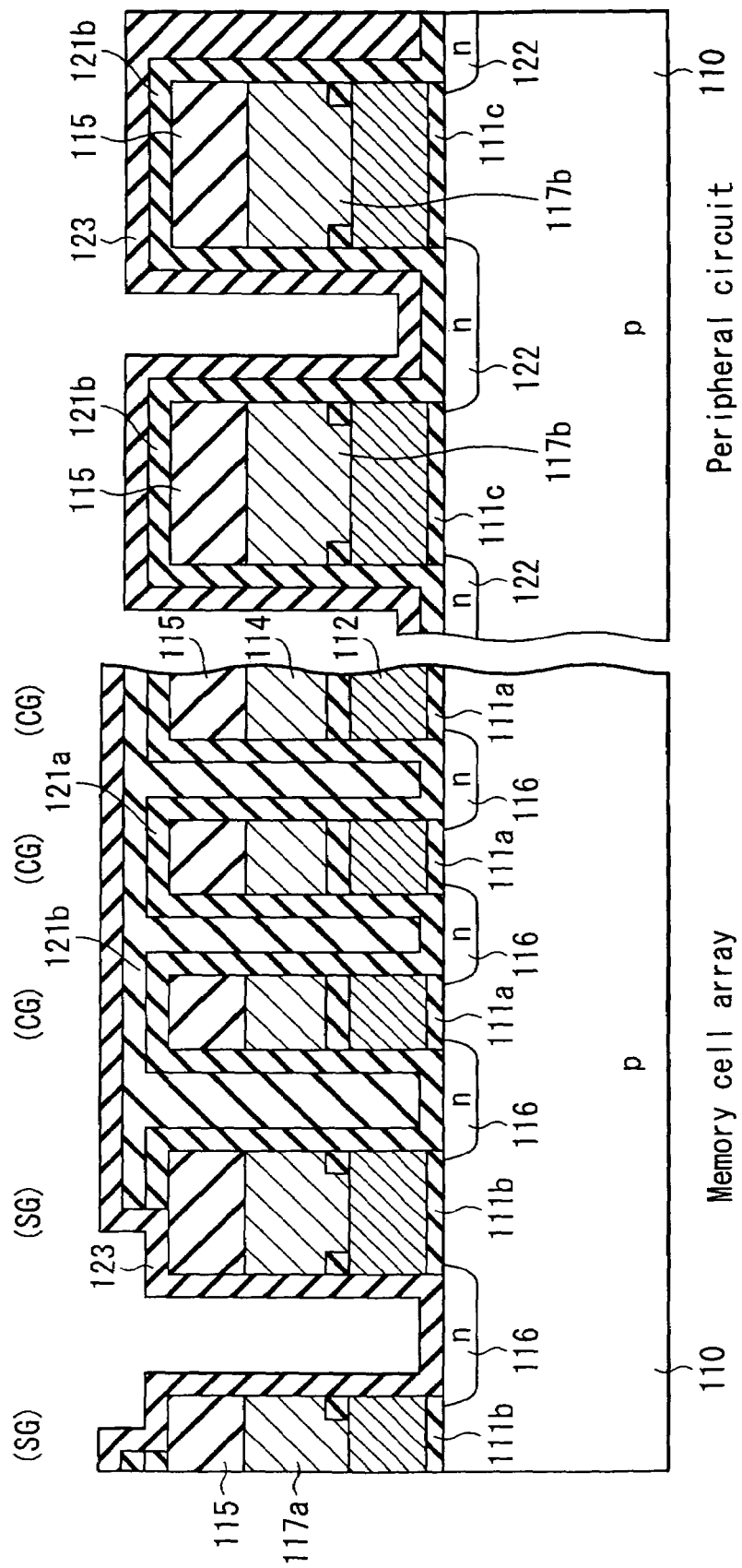

After the element formation step ends as described above, as shown in FIG. 27, the bit line contact portion of the cell array region, and the silicon oxide films 121a and 121b of the source line contact portion (not shown) are selectively etched. Subsequently, as shown in FIG. 28, a silicon nitride film 123 is deposited so as to protect the gate sidewall exposed in these contact portions. The silicon nitride film 123 is also formed on the side surface of the gate electrode 117b covered with the silicon oxide film 121b of the peripheral circuit.

This silicon nitride film 123 can securely prevent the contact and gate from being short-circuited in a step of forming the contacts of the NAND cell array and peripheral circuit. Moreover, in the contact portions of the NAND cell array, the double-layer silicon oxide films 121a and 121b are removed to form the silicon nitride film 123, and therefore a large contact area can be secured.

Figure 29:
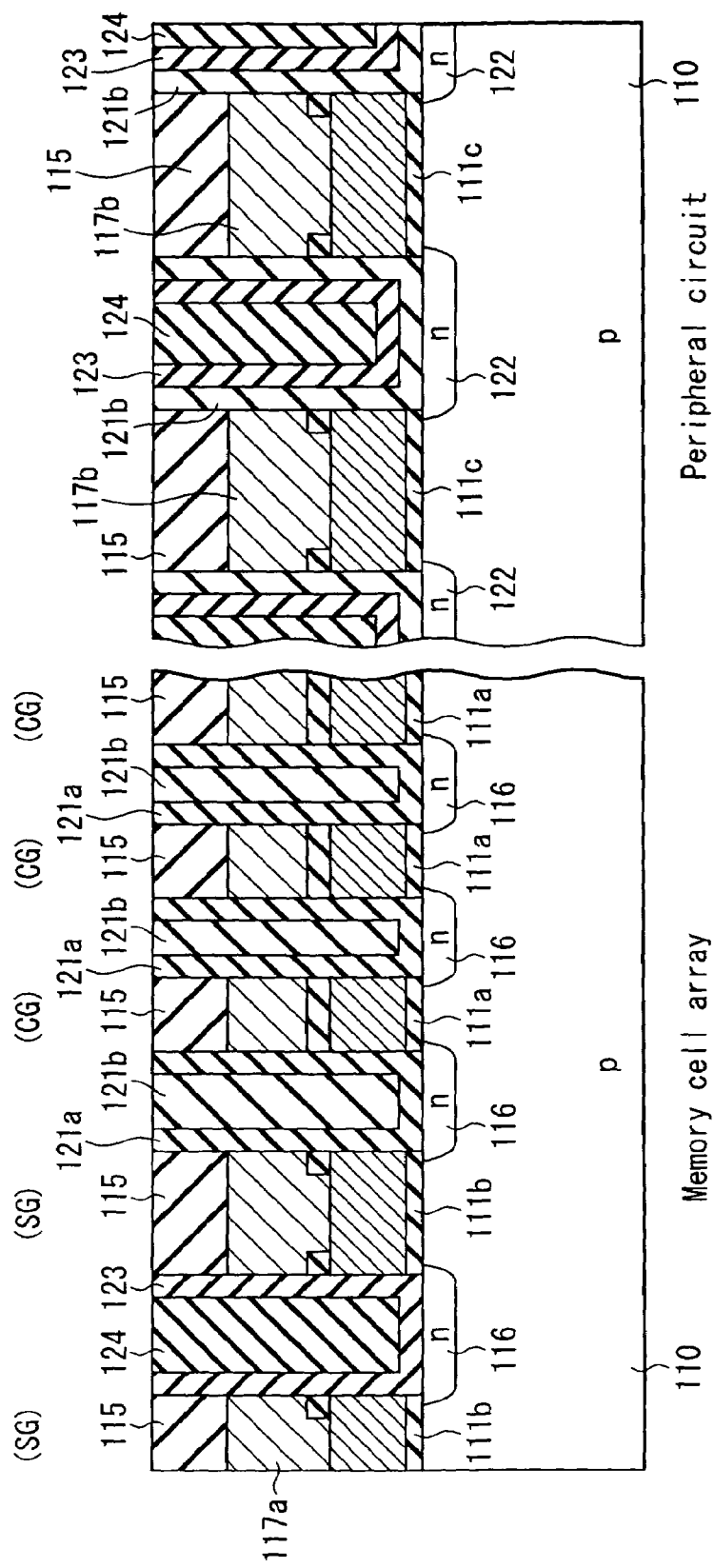

Subsequently, an interlayer insulator 124 such as BPSG is deposited, and flatted by the CMP treatment or fluidization by the thermal treatment as shown in FIG. 29. FIG. 29 shows a state obtained by performing CMP until the silicon nitride film 115 is exposed.

Figure 30:
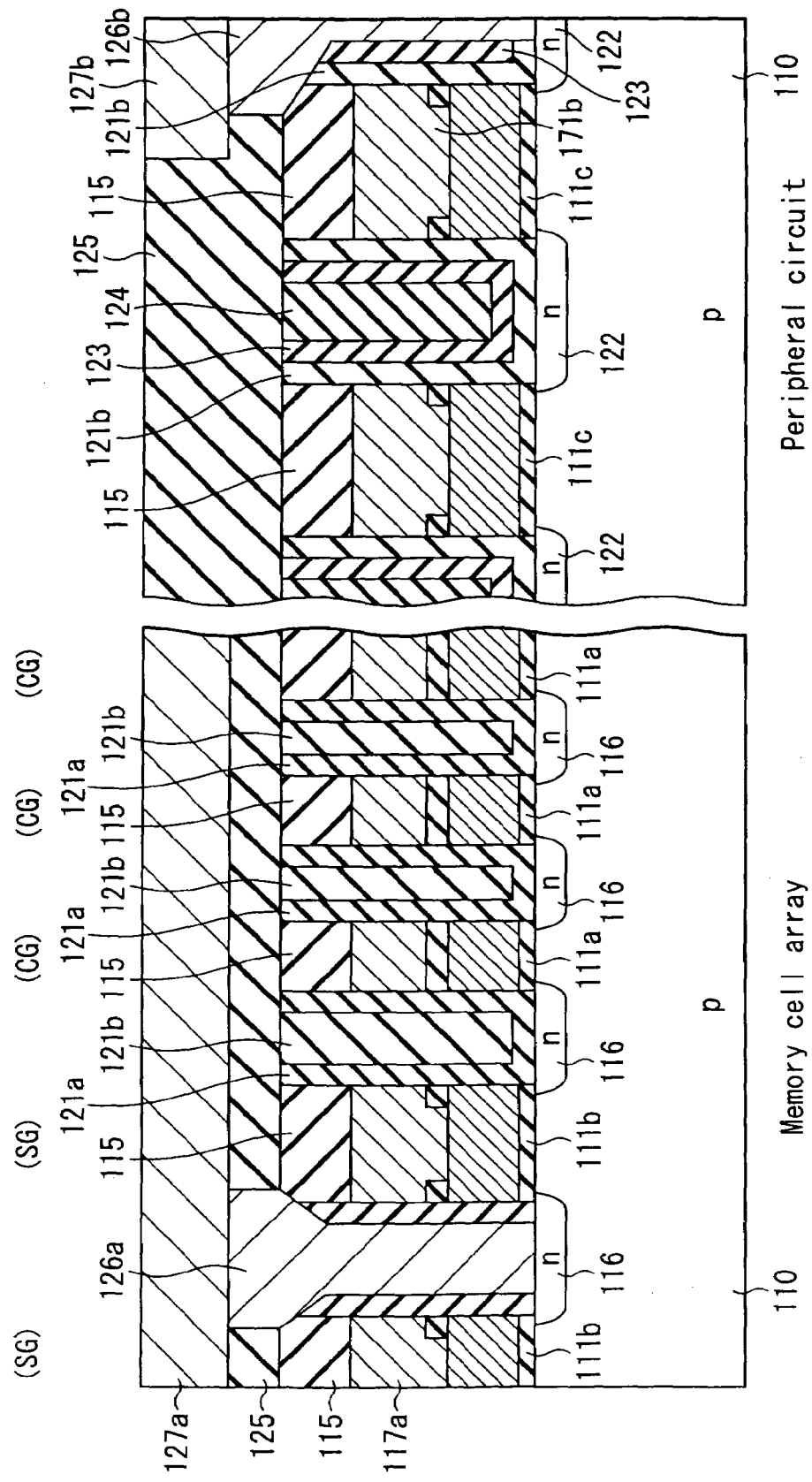

Thereafter, following usual steps, a metal interconnect is formed. That is, as shown in FIG. 30, an interlayer insulator 125 is deposited, and metal interconnects 127a and 127b of the memory cell array region and peripheral circuit region are formed on the interlayer insulator. In FIG. 30, contact plugs 126a and 126b to be connected to the diffusion layers are buried in the interlayer insulator 125 of the contact portion, and the metal interconnects 127a and 127b are buried in the interlayer insulator 125 in a damascene method and connected to the diffusion layers via the contact plugs 126a and 126b.

According to the present embodiment, in a step of flatly filling between the gate portions of the NAND cell array with the first and second silicon oxide films, the first silicon oxide film is removed from the peripheral circuit region. Therefore, as shown in FIG. 26, the sidewall insulation film of the gate electrode 117b is not formed very thickly in the step of forming the source and drain diffusion layers of the peripheral circuit. Therefore, even when a gate electrode pitch is narrowed, it is possible to form the source and drain diffusion layers 122 without any offset with respect to the gate electrode. Moreover, it is possible to securely make the contact with respect to the source and drain diffusion layers 122.

It is to be noted that the ion implantation step for forming the source and drain diffusion layers 122 of the peripheral circuit may also be performed after forming the silicon nitride film 123 on the sidewall of the gate electrode 117b as shown in FIG. 28. In this case, there is a possibility of the gate offset depending on the thickness of the silicon nitride film 123 and silicon oxide film 121b. However, to avoid this, for example, before or after the step of forming the source and drain diffusion layers 122 into the memory cell array, the lightly-doped source and drain diffusion layers may also be formed with respect to the peripheral circuit around the stage of FIG. 23A. Moreover, when the ion implantation is performed in high doping in the stage of FIG. 28, the peripheral circuit transistor obtains LDD structure.

In the present embodiment, the silicon oxide film is used as the first and second insulation films, but the oxynitride films can also be used in the same manner as in the first embodiment.

Fifth Embodiment

In the fourth embodiment, the silicon nitride film 123 formed in the step of FIG. 28 remains as such in the bottom of the contact portion (on the specific diffusion layers 116 and 122). Therefore, at a contact hole formation, the silicon oxide film and silicon nitride film have to be both etched. Particularly in the peripheral circuit region, there is the stacked film of the silicon oxide film 121b and silicon nitride film 123 in the bottom of the contact portion. Therefore, in the subsequent step of forming the contact hole after the interlayer insulator is formed, the silicon oxide film, silicon nitride film, and silicon oxide film need to be successively etched. Therefore, when the contact hole is deepened by a fine dimension, no low-resistance contact is possibly obtained because of etching remnant. Moreover, when the diffusion layer of the peripheral circuit is formed in the state of FIG. 28, the ions have to be implanted through the stacked film of the silicon oxide film 121b and silicon nitride film 123, and ion implantation conditions become strict.

Figure 31:
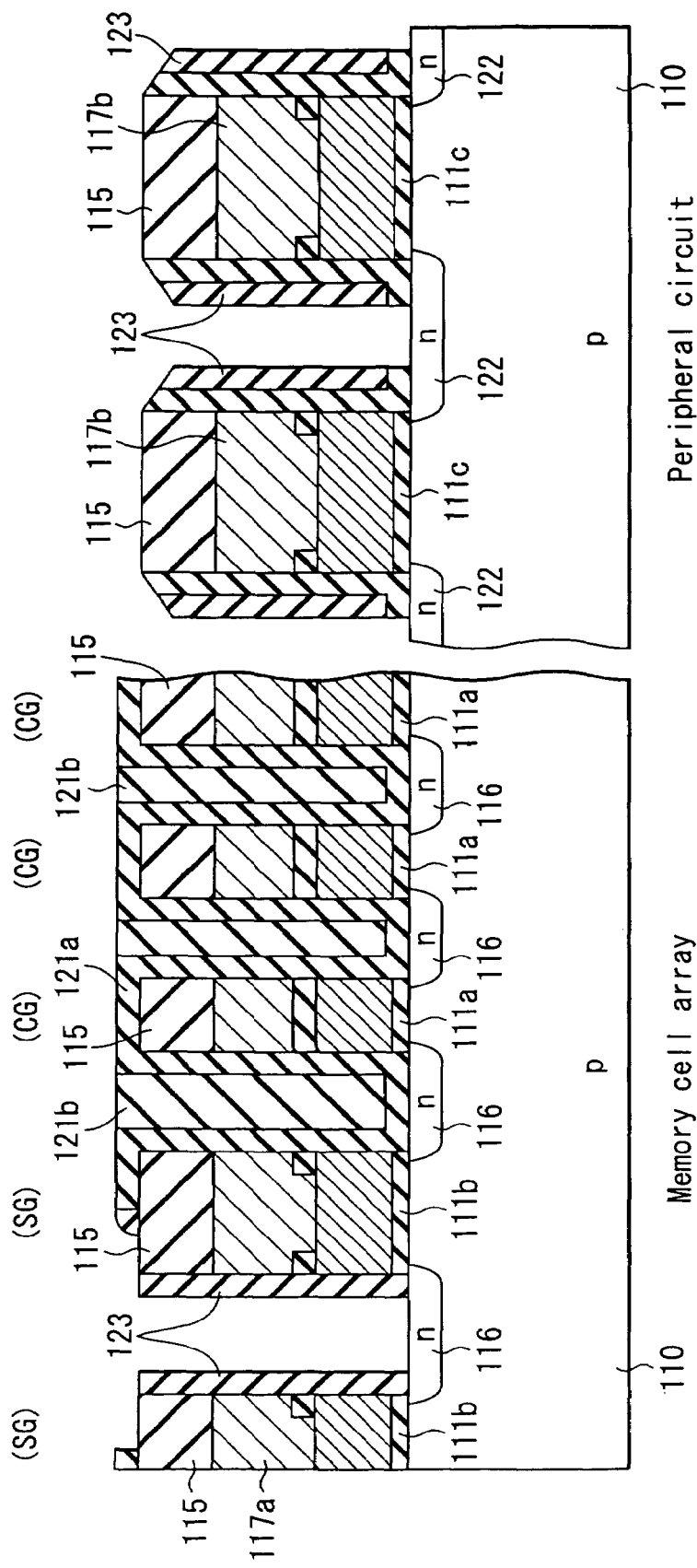
FIGS. 31 to 33 are sectional views showing the manufacturing steps of the semiconductor device according to a fifth embodiment in the stepwise manner.
Figure 32:
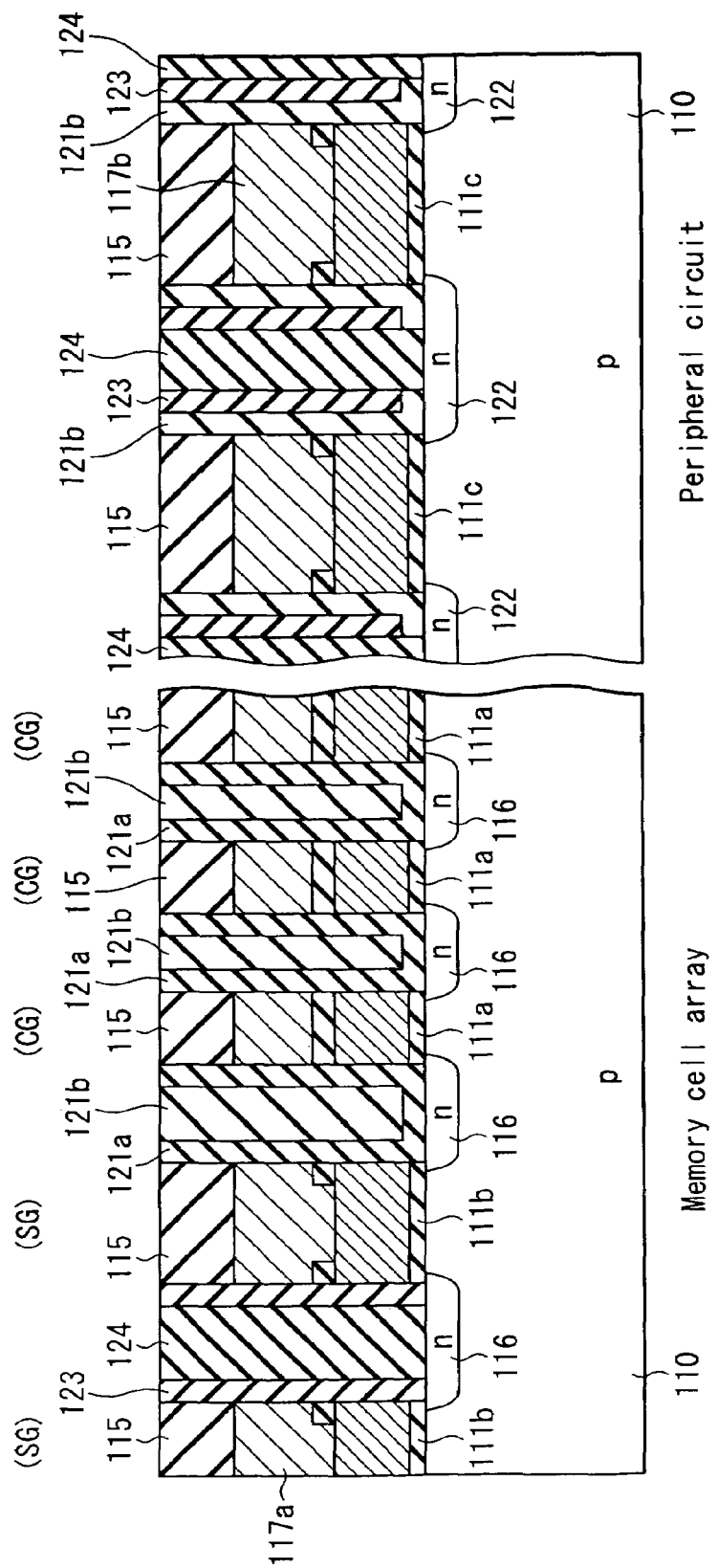
Figure 33:
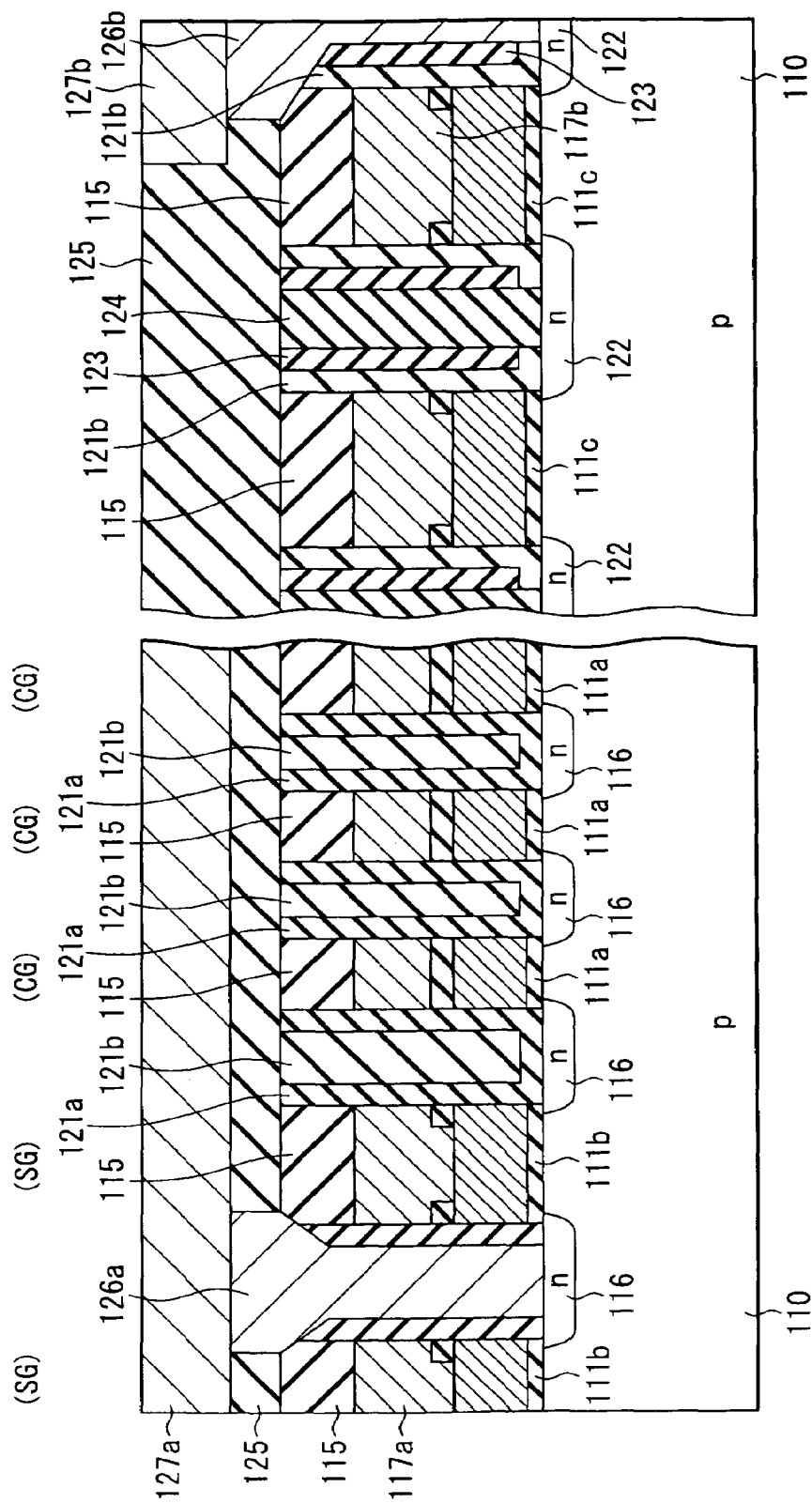

To solve these disadvantages, the silicon nitride film 123 formed in FIG. 28 may be removed except the film 123 only on each gate sidewall. A fifth embodiment includes such manufacturing steps as shown in FIGS. 31 to 33. Firstly, the steps are performed as shown in FIGS. 23A and 23B to 28 in the same manner as in the fourth embodiment. Thereafter, the silicon nitride film 123 is etched by RIE, and as shown in FIG.

31 the film 123 is left only on the gate electrode sidewalls in the contact portion of the memory cell array and the peripheral circuit region.

Thereafter, the interlayer insulator 124 is deposited and flatted as shown in FIG. 32 in the same manner as in the fourth embodiment. Furthermore, as shown in FIG. 33, the interlayer insulator 125 is deposited, and the metal interconnects 127a and 127b are formed.

According to the present embodiment, the silicon nitride film does not exist in the contact portion of the memory cell array and on the diffusion layer of the peripheral circuit region, and it is easy to form the contact plug. Moreover, when the ion implantation is performed in the state of FIG. 31, the forming of the diffusion layer of the peripheral circuit is also facilitated.

Sixth Embodiment

Figure 34:
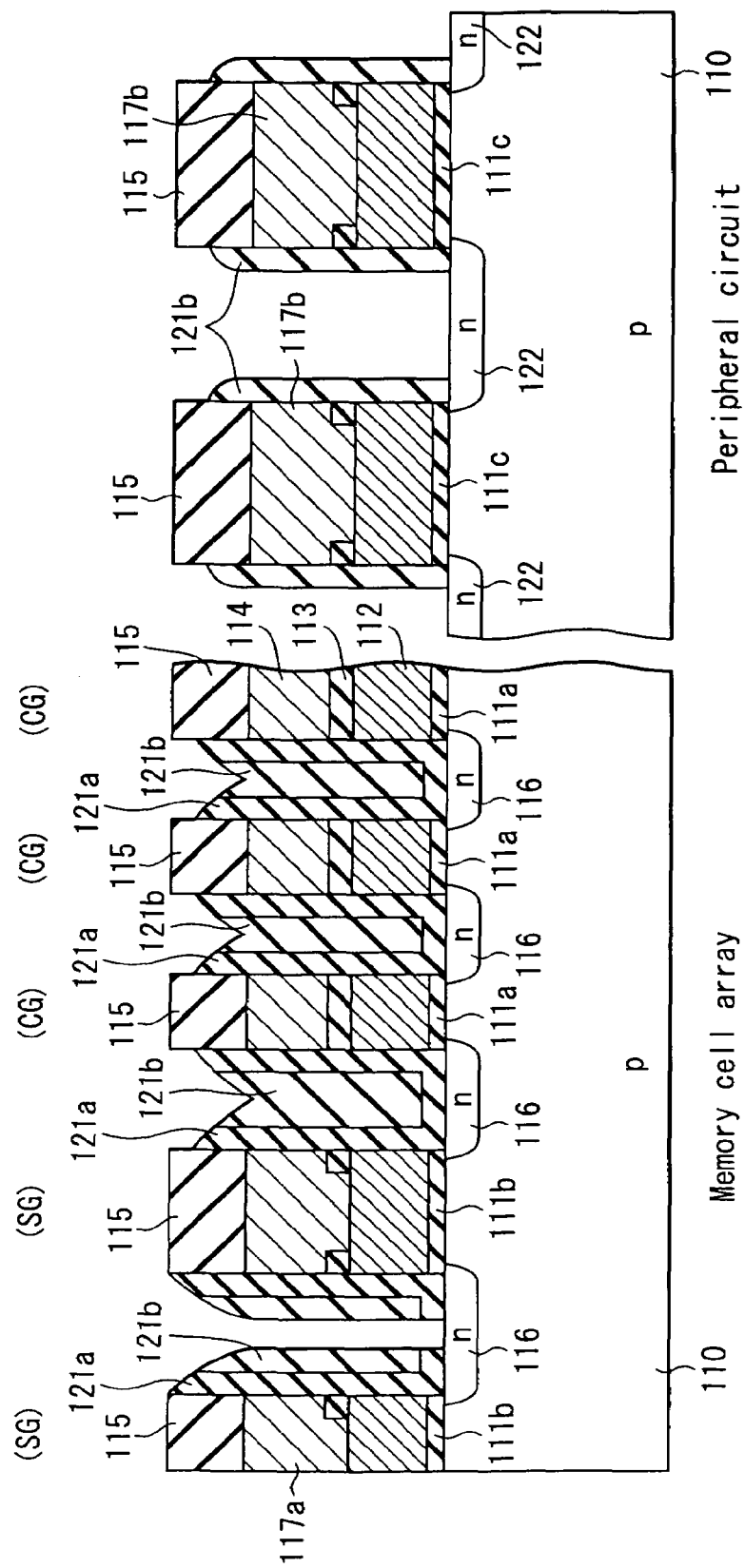
FIGS. 34 to 38 are sectional views showing the manufacturing steps of the semiconductor device according to a sixth embodiment in the stepwise manner.

In a sixth embodiment, an embodiment in which the region of the NAND cell array is completely covered with the silicon nitride film will be described. First, the same steps as those described in the fourth embodiment and shown in FIGS. 24 to 26 are carried out. That is, in the same manner as in the fourth embodiment, the NAND cell array region is covered with the double-layer silicon oxide film, and thus the peripheral circuit region is covered only with the second silicon oxide film in the double-layer silicon oxide films. Thereafter, the silicon oxide film is etched by RIE, and the silicon nitride film 115 is exposed as shown in FIG. 34. At this time, depressions of the double-layer silicon oxide films 121a and 121b are formed between the gate portions of the memory cell array. The drawing shows that a V-shaped depression is formed, but the depression has a U-shape depending on the etching conditions. Regarding the contact portion of the NAND cell array and the gate electrode of the peripheral circuit, the silicon oxide film is formed only on the sidewall.

Figure 35:
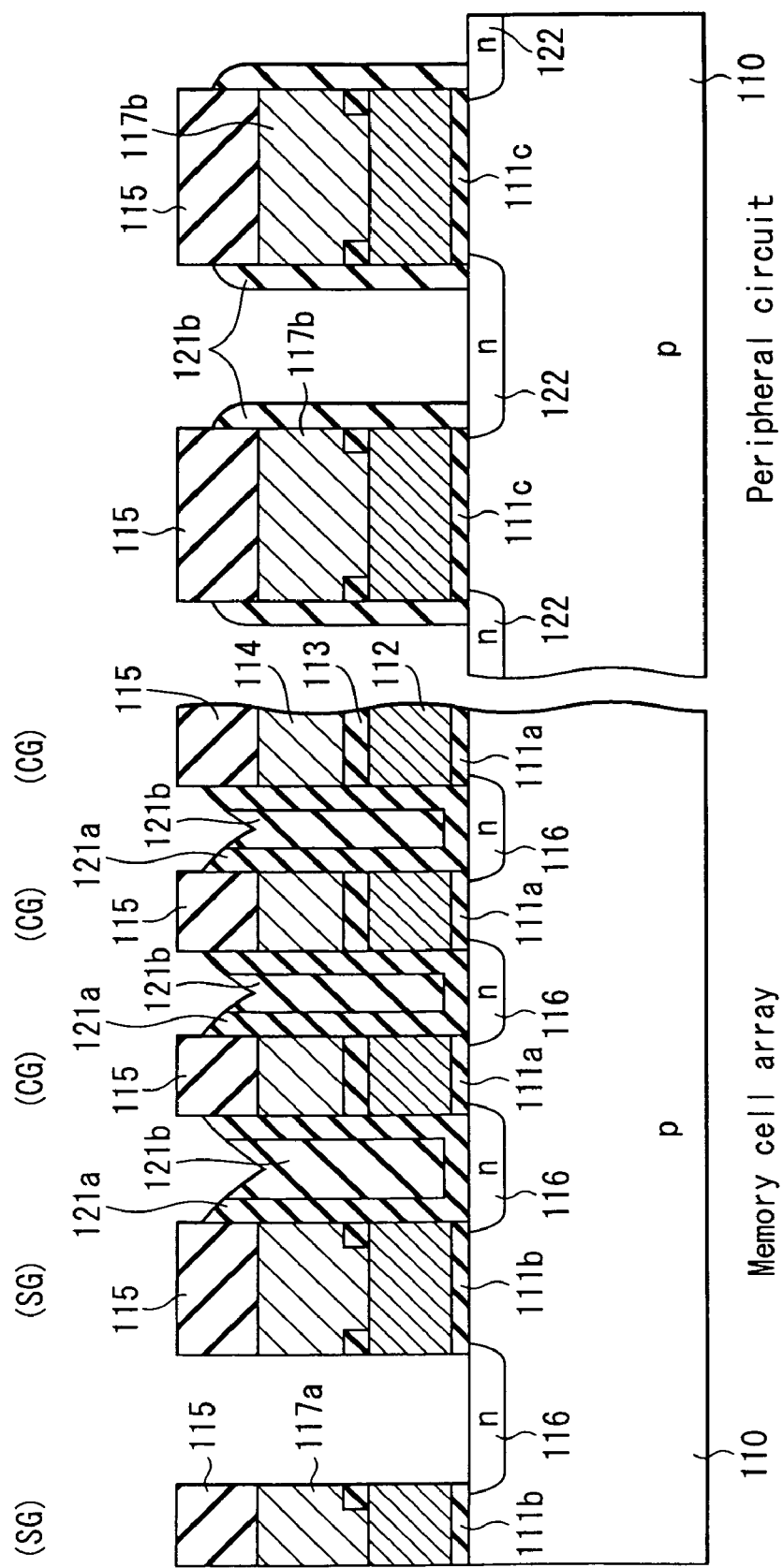
Figure 36:
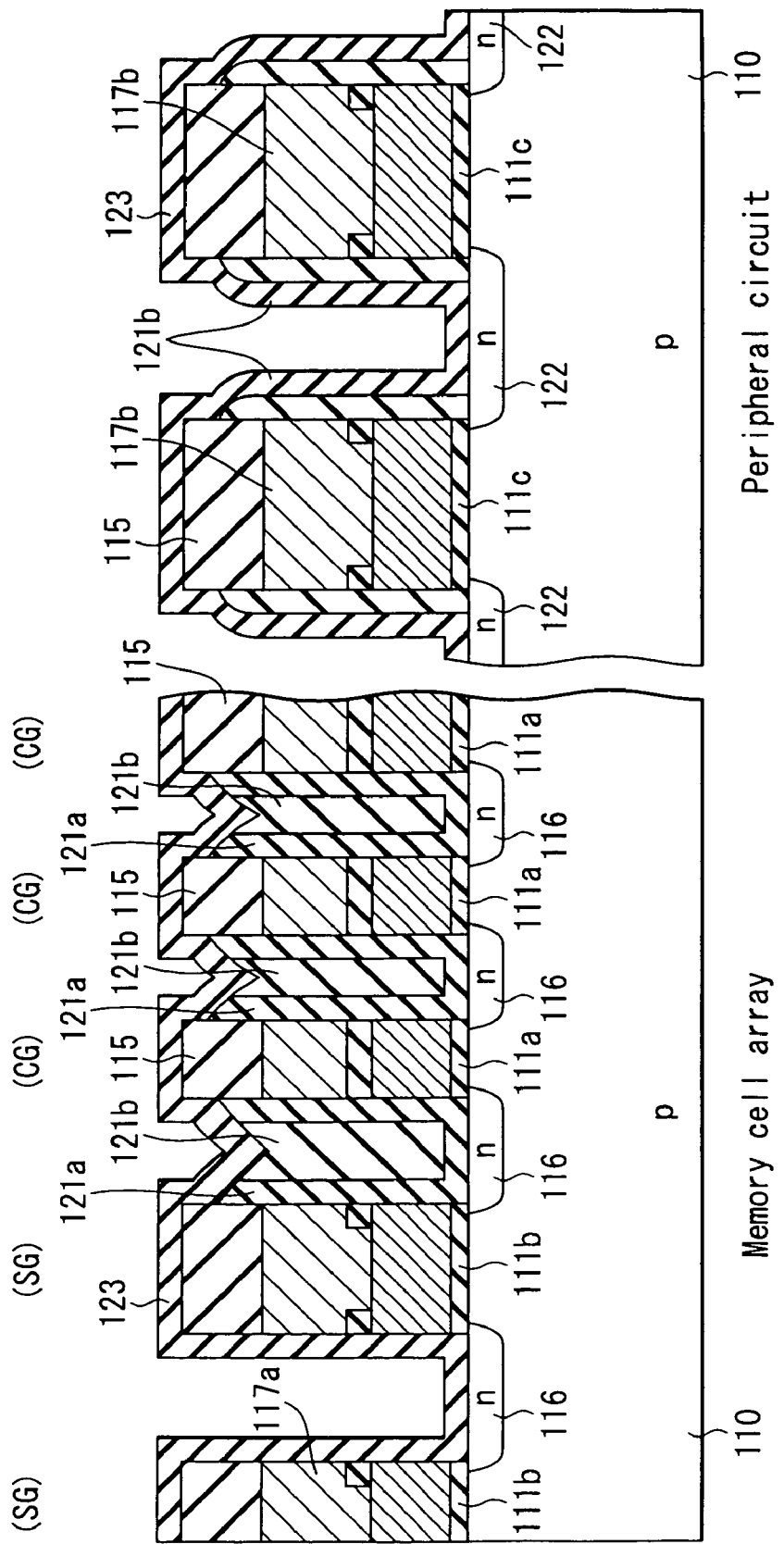

Thereafter, steps similar to those of the fourth embodiment are performed. That is, as shown in FIG. 35, the bit line contact portion of the memory cell array region, and the silicon oxide films 121a and 121b of the source line contact portion (not shown) are selectively etched. Subsequently, as shown in FIG. 36, the silicon nitride film 123 is deposited so as to protect the gate sidewall exposed in these contact portions.

Figure 37:
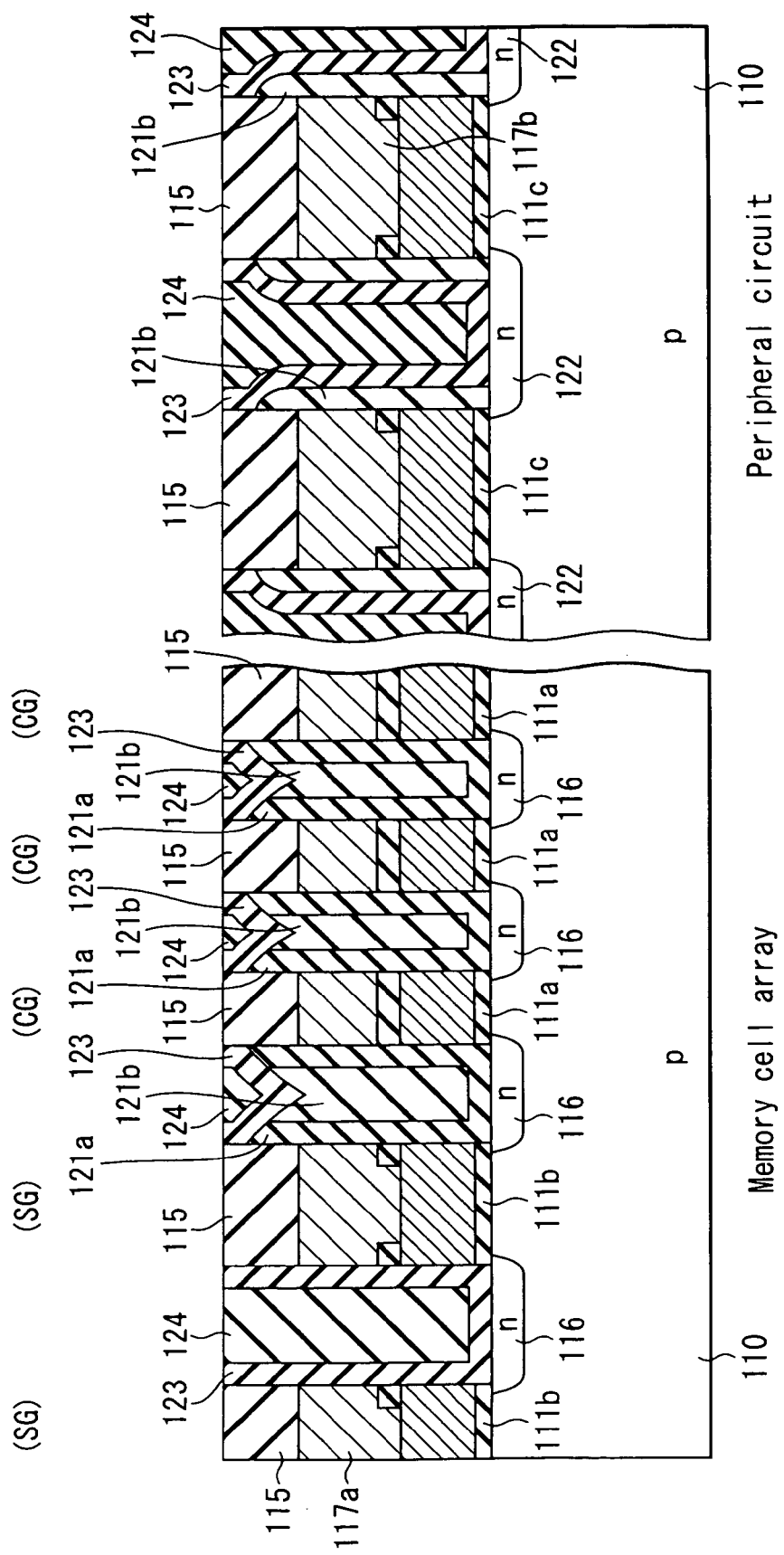

Next, as shown in FIG. 37, the interlayer insulator 124 such as BPSG is deposited, and the surface of the insulator is flatted by the CMP treatment or fluidization by the thermal treatment. FIG. 37 shows the structure obtained by performing the polishing of CMP until the silicon nitride film 115 is exposed.

Since the silicon nitride film 123 fills in the depression formed by the oxide film etching of the NAND cell array, the whole NAND cell array is completely covered with the silicon nitride films 115 and 123.

Figure 38:
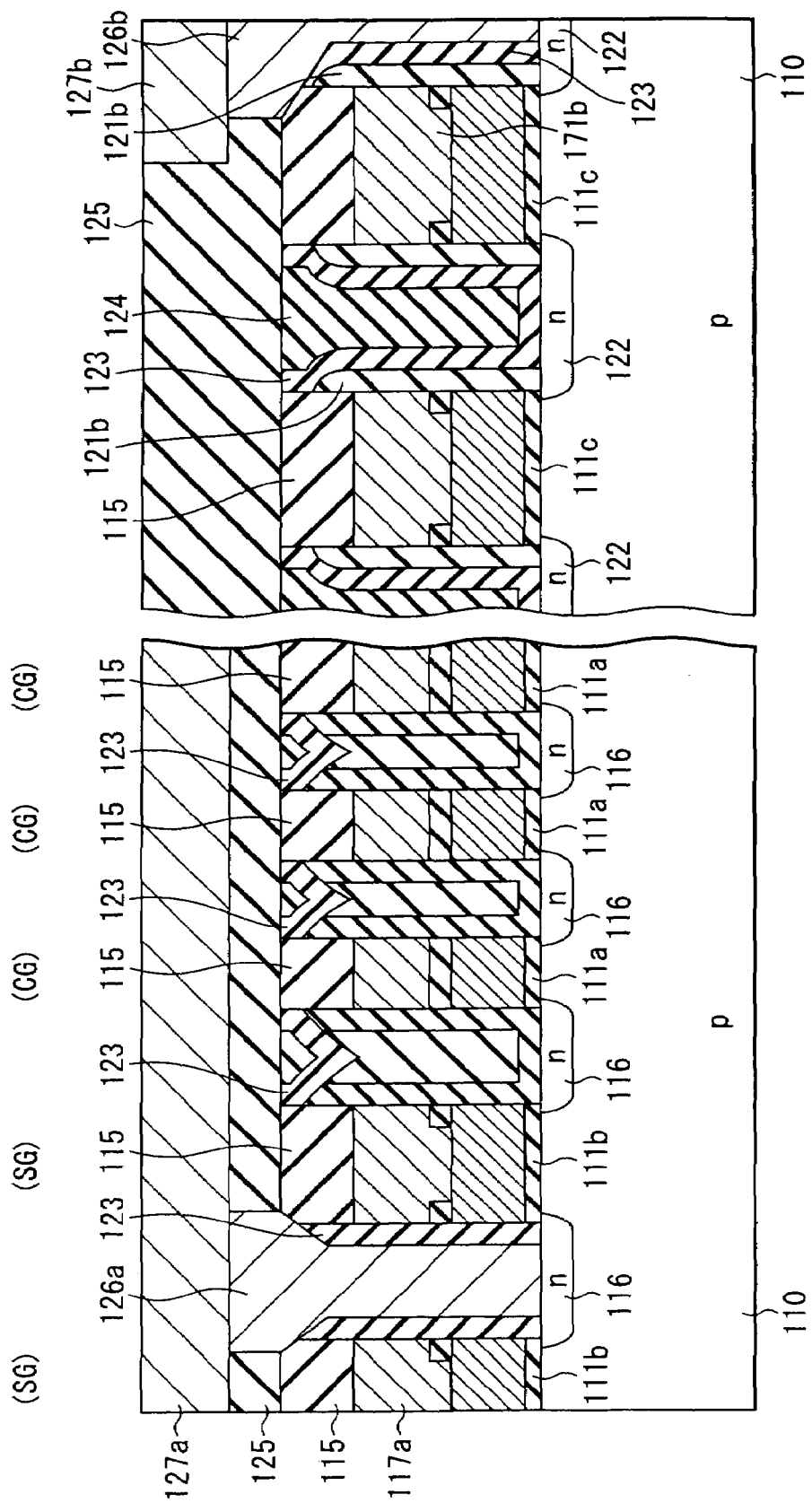

Thereafter, following the conventional steps, the metal interconnects are formed. That is, as shown in FIG. 38, the interlayer insulator 125 is deposited, and the metal interconnects 127a and 127b of the memory cell array region and peripheral circuit region are formed on the interlayer insulator 125. In FIG. 38, the contact plugs 126a and 126b to be connected to the diffusion layers are buried in the interlayer insulator 125 of the contact portion, and the metal interconnects 127a and 127b are buried in the interlayer insulator 125 by the damascene method and connected to the diffusion layers via the contact plugs 126a and 126b.

As described above, according to the present embodiment, in addition to the effect of the fourth embodiment, since the NAND cell array region is completely covered with the silicon nitride film, the impurities such as hydrogen are restrained from being diffused into the memory cell region from the upper side, and there is another effect that memory cell characteristics are prevented from being deteriorated.

As described above, according to the fourth to sixth embodiments, the peripheral circuit transistor formed by the process substantially common to the memory cell unit can be formed at a fine pitch without impairing the performance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising:

forming a first memory cell gate array including a plurality of memory cell gate electrodes, a first selection gate pair formed on opposite ends of the first memory cell gate array, a second memory cell gate array including a plurality of memory cell gate electrodes, and a second selection gate pair formed on opposite ends of the second memory cell gate array such that one gate of the second selection gate pair is disposed adjacent to one gate of the first selection gate pair, while forming a plurality of peripheral gates apart from the first memory cell gate array, the first selection gate pair, the second memory cell gate array, and the second selection gate pair on a semiconductor substrate;

by using the first memory cell gate array, the first selection gate pair, the second memory cell gate array, the second selection gate pair, and the plurality of peripheral gates as masks, forming a plurality of diffusion regions in the semiconductor substrate;

forming a first insulation film including a main component other than nitrogen over a whole surface of the semiconductor substrate, so as to fill between adjacent ones of the plurality of memory cell gate electrodes, between the opposite ends of the first memory cell gate array and the first selection gate pair, and between the opposite ends of the second memory cell gate array and the second selection gate pair and cover the plurality of memory cell gate electrodes such that the first insulation film plugs at least an upper end portion between the adjacent ones of the plurality of memory cell gate electrodes, and to form the first insulation film on a side surface of one gate of the first selection gate pair disposed adjacent to and opposite to that of one gate of the second selection gate pair, a first region of the semiconductor substrate between the opposite selection gates, side surfaces of the plurality of peripheral gates, and a second region of the semiconductor substrate disposed adjacent to the side surfaces of the peripheral gates;

removing the first insulation film on the first region and the second region;

forming a second insulation film including nitrogen as the main component over a whole exposed surface;

forming an interlayer insulation film having a large etching selectivity to the second insulation film on the second insulation film;

selectively etching the interlayer insulation film on the first region and the second region to expose some of the plurality of diffusion regions, leaving portions between adjacent ones of the plurality of memory cell gate electrodes filled with the first insulating film, and to form contact holes; and filling a conductive material in the contact holes to connect the conductive material to the selectively exposed some of the plurality of diffusion regions formed in the first region and the second region, wherein the first insulation film includes silicon oxide, the second insulation film includes nitride, and silicon nitride is not included between the adjacent ones of the plurality of memory cell gate electrodes, and the removing of the first insulating film includes removing the first insulating film formed on the sidewall of each of the opposite selection gates.

2. The manufacturing method of the semiconductor device according to claim 1, wherein the forming of the second insulation film includes forming the second insulating film thinner than the first insulation film.

* * * * *